US006845349B1

(12) United States Patent
Sasaki et al.

(10) Patent No.: US 6,845,349 B1
(45) Date of Patent: Jan. 18, 2005

(54) METHOD FOR DESIGNING SEMICONDUCTOR INTEGRATED CIRCUIT AND AUTOMATIC DESIGNING DEVICE

(75) Inventors: Yasuhiko Sasaki, Koganei (JP); Kazuo Yano, Hino (JP); Shunzo Yamashita, Tokorozawa (JP); Koichi Seki, Hino (JP)

(73) Assignee: Renesas Technology Corp., Tokyo (JP)

( * ) Notice: Subject to any disclaimer, the term of this patent is extended or adjusted under 35 U.S.C. 154(b) by 1034 days.

(21) Appl. No.: 09/659,735

(22) Filed: Sep. 11, 2000

Related U.S. Application Data

(63) Continuation of application No. 08/930,219, filed as application No. PCT/JP96/01104 on Apr. 24, 1996, now Pat. No. 6,260,185, and a continuation-in-part of application No. 08/633,486, filed on Apr. 17, 1996, now Pat. No. 5,712,792, and a continuation-in-part of application No. 08/633,053, filed on Apr. 16, 1996, now Pat. No. 5,923,189.

(30) Foreign Application Priority Data

Apr. 21, 1995 (JP) ............................................. 7-96487
Apr. 25, 1998 (JP) ............................................. 7-99204

(51) Int. Cl.[7] ............................. G06G 7/62; G06F 17/50
(52) U.S. Cl. ............................. 703/13; 703/14; 703/15; 716/18
(58) Field of Search ........................ 703/13–15; 716/18

(56) References Cited

U.S. PATENT DOCUMENTS

| | | |
|---|---|---|
| 4,477,904 A | 10/1984 | Thorsrud |
| 4,541,067 A | 9/1985 | Whitaker |
| 4,912,348 A | 3/1990 | Maki et al. |
| 5,144,582 A | 9/1992 | Steele |
| 5,243,538 A | 9/1993 | Okuzawa et al. |
| 5,493,504 A | 2/1996 | Minato |
| 5,581,202 A | 12/1996 | Yano et al. |
| 5,649,165 A | 7/1997 | Jain et al. |
| 6,301,692 B1 * | 10/2001 | Kumashiro et al. ........... 716/10 |

FOREIGN PATENT DOCUMENTS

| | | |
|---|---|---|
| JP | 1-216622 | 8/1989 |
| JP | 1-256219 | 10/1989 |
| JP | 4-112270 | 4/1992 |
| JP | 4-160589 | 6/1992 |
| JP | 6-20000 | 1/1994 |
| JP | 6-215065 | 8/1994 |
| JP | 7-168874 | 7/1995 |

OTHER PUBLICATIONS

Berkelaar et al. "Efficient Orthonormality for Synthesis with Pass–Transistor Selectors"; IEEE ICCAD–95; pp. 256–263; Nov. 1995.*
Information Processing Society of Japan, Journal of Information Processing, vol. 34, No. 5, May 1993, pp. 593–599.
Information Processing Society of Japan, Proceedings of 1994 Autumn National Conference, vol. A, p. 64.

(List continued on next page.)

Primary Examiner—Hugh Jones
(74) Attorney, Agent, or Firm—Mattingly, Stanger & Malur, P.C.

(57) ABSTRACT

A program for automatically designing a logic circuit used for a method of designing a pass transistor circuit, by which the number of required transistors, delay time, power consumption and chip area of the pass transistor circuit is reduced. The program executes the following steps: a) receiving inputted logic functions which define the logical relationship between the inputs and the outputs, and an inputted target specification, b) generating a binary decision diagram from part of the logic functions received at (a), c) replacing the diagram nodes formed at (b) with pass transistor circuit, d) judging whether or not the simulation characteristics of the pass transistor circuit described in (c) meets the target specification described in (a), and executing the following steps when the judgment is "no", e) replacing part of the diagram generated by the procedure described in (b) with another diagram, f) allocating a new binary decision diagram to the control inputs of the nodes of the replaced diagram prepared at (e), and g) repeating the steps (c) and (d) for the diagram prepared at (f).

27 Claims, 34 Drawing Sheets

OTHER PUBLICATIONS

Proceedings of IEEE 1994 Custom Integrated Circuits Conference, 1994, pp. 603–606.

IEEE Transactions on Computers, vol. C–35, No. 8, Aug. 1986, pp. 577–691.

Proceedings of the Information Processing Society 44th National Congress, pp. 6–143 to 6–144, no date.

IEEE Journal of Solid–State Circuits, vol. SC–22, No. 2, Apr. 1987, "CMOS Differential Pass–Transistor Logic Design", Pasternak et al, pp. 216–222.

IEEE Journal of Solid–State Circuits, vol. SC–25, No. 2, Apr. 1990, "A 3.8–ns CMOS 16×16–b Multiplier Using Complementary Pass–Transistor Logic", Yano et al, pp. 388–395.

IEEE 1994 Custom Integrated Circuits Conference, 1994 Digest, "Lean Integration: Achieving a Quantum Leap in Performance and Cost of Logic LSIs", Yano et al, pp. 603–606.

Proceeding of the 1994 Autumn Convention of the Institute of Electronics, Information and Communication Engineers of Japan, Edition of Fundamentals and Interfaces, p. 64.

IEEE Transactions on Computers, vol. C–35, No. 9, Aug. 1986, "Graph–Based Algorithms for Boolean Function Manipulation", R. Bryant, pp. 677–691.

Digest of Technical Papers of IEEE 1995 Symposium on Low Power Electronics, 1995, "Multi–Level Pass–Transistor Logic for Low–Power ULSIs", Y. Sasaki et al, pp. 14–15.

Tai: Pipelined Fault Simulation on Parallel Machines using the circuit flow graph; 1993 IEEE Int. Cont. on Comp. Design; pp. 564–567 10/93.

Caban et al.; A parallel BDD engine for logic verification; 5th annual IEEE Int. ASIC Conf., pp. 499–502 9/92.

Fujita et al.; Automatic and semi–automatic verification of switch–level circuits with temporal logic and binary decision diagrams; ICCAD–90; pp. 38–41 11/90.

* cited by examiner

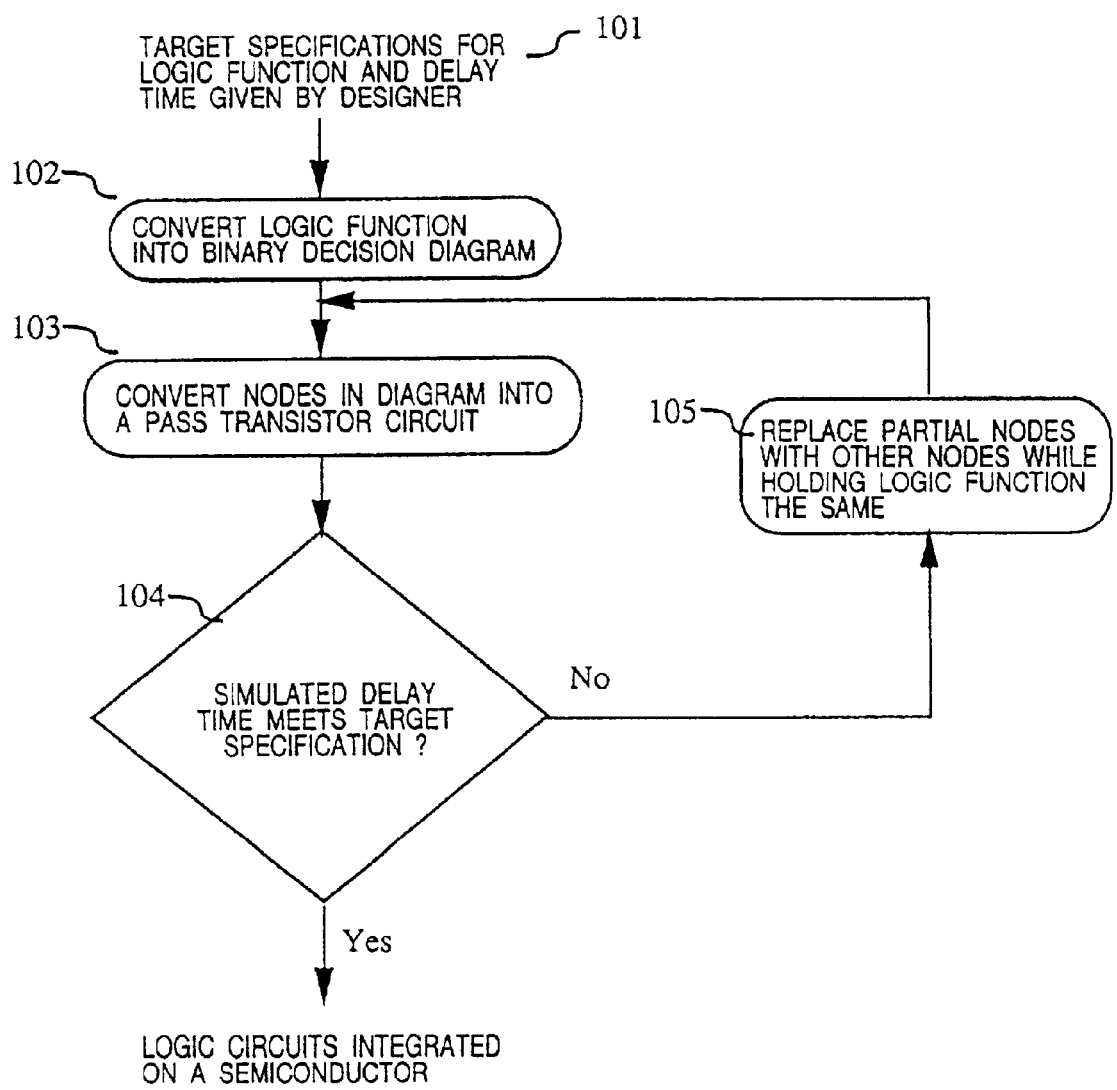

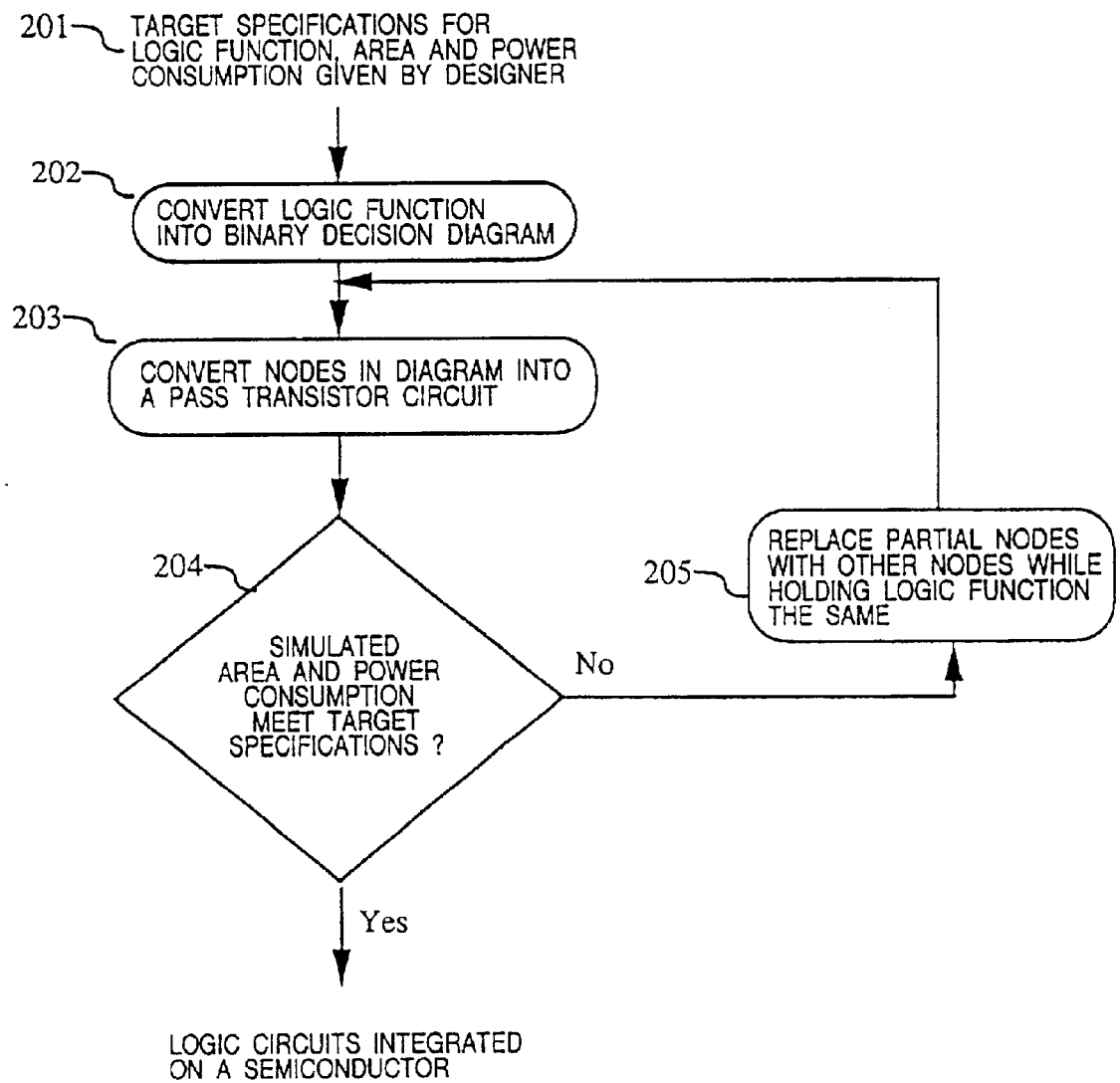

FIG. 3(a)

301 — LOGIC FUNCTION DESIRED BY DESIGNER $$OUT = A \cdot B \cdot D \cdot E \cdot G \cdot H + A \cdot B \cdot \overline{D} \cdot F + A \cdot B \cdot \overline{E} \cdot F + \overline{A} \cdot C + \overline{B} \cdot C;$$

FIG. 6(a)

LOGIC FUNCTION DESIRED BY DESIGNER

601 — OUT = $A \cdot B \cdot D \cdot E \cdot G \cdot H + A \cdot B \cdot \overline{D} \cdot F + A \cdot B \cdot \overline{E} \cdot F + \overline{A} \cdot C + \overline{B} \cdot C$;

FIG. 7(a)

LOGIC FUNCTION DESIRED
BY DESIGNER

701 — OUT1 = A · B · G · H + $\overline{A}$ · C + $\overline{B}$ · C ;
702 — OUT2 = A · B · G · H + $\overline{A}$ · D + $\overline{B}$ · D ;
703 — OUT3 = A · B · G · H + $\overline{A}$ · E + $\overline{B}$ · E ;
704 — OUT4 = A · B · G · H + $\overline{A}$ · F + $\overline{B}$ · F ;

FIG. 8(a)

LOGIC FUNCTION DESIRED
BY DESIGNER

801 — $OUT1 = A \cdot B \cdot H \cdot G + \overline{A} \cdot C + \overline{B} \cdot C;$ 802 — $OUT2 = A \cdot B \cdot H \cdot G + \overline{A} \cdot D + \overline{B} \cdot D;$ 803 — $OUT3 = A \cdot B \cdot H \cdot G + \overline{A} \cdot E + \overline{B} \cdot E;$ 804 — $OUT4 = A \cdot B \cdot H \cdot G + \overline{A} \cdot F + \overline{B} \cdot F;$

FIG. 9(a)

LOGIC FUNCTION DESIRED
BY DESIGNER

901    OUT = A · B · C · D · E · F · G · H
· I · J · K · L · M · N · P · Q;

FIG. 10

OUT1 = A · B · H · G + $\overline{A}$ · C + $\overline{B}$ · C ;

TRUTH TABLE OF LOGIC
FUNCTION OUT1

| | | INPUT | | | OUTPUT |
|---|---|---|---|---|---|
| A | B | C | G | H | OUT1 |
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 1 |
| 0 | 0 | 1 | 0 | 1 | 1 |
| 0 | 0 | 1 | 1 | 0 | 1 |
| 0 | 0 | 1 | 1 | 1 | 1 |
| 0 | 1 | 0 | 0 | 0 | 0 |
| 0 | 1 | 0 | 0 | 1 | 0 |
| 0 | 1 | 0 | 1 | 0 | 0 |
| 0 | 1 | 0 | 1 | 1 | 0 |
| 0 | 1 | 1 | 0 | 0 | 1 |
| 0 | 1 | 1 | 0 | 1 | 1 |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 0 |
| 1 | 0 | 0 | 1 | 0 | 0 |
| 1 | 0 | 0 | 1 | 1 | 0 |
| 1 | 0 | 1 | 0 | 0 | 1 |
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 0 |
| 1 | 1 | 0 | 0 | 1 | 0 |
| 1 | 1 | 0 | 1 | 0 | 0 |
| 1 | 1 | 0 | 1 | 1 | 1 |
| 1 | 1 | 1 | 0 | 0 | 0 |
| 1 | 1 | 1 | 0 | 1 | 0 |
| 1 | 1 | 1 | 1 | 0 | 0 |
| 1 | 1 | 1 | 1 | 1 | 1 |

METHOD FOR DESIGNING SEMICONDUCTOR INTEGRATED CIRCUIT AND AUTOMATIC DESIGNING DEVICE

This is a continuation application of U.S. Ser. No. 08/930,219, filed Oct. 20, 1997, now U.S. Pat. No. 6,260,185, which is a 371 of PCT/JP96/01104 filed Apr. 24, 1996, and a CIP of Ser. No. 08/633,486 filed Apr. 17, 1996, now U.S. Pat. No. 5,712,792, and a CIP of Ser. No. 08/633,053 filed Apr. 16, 1996, now U.S. Pat. No. 5,923,189.

TECHNICAL FIELD

The present invention relates to a method and an automatic designing device for designing semiconductor integrated circuits, and more particularly to a designing method and an automatic designing device suitable for designing such semiconductor integrated circuits as general-purpose processors, signal processors, video processors, etc. including logic circuits in part.

BACKGROUND ART

In the IEEE TRANSACTIONS ON COMPUTERS, Vol. c-35, No.8, August 1986, pp. 677–691 (hereinafter referred to as Cited Reference 1), an effective method for logic operations using binary decision diagrams is disclosed.

Also, Proceedings of 1994 Autumn Convention of the Institute of Electronics, Information and Communication Engineers of Japan, edition of fundamentals and interfaces, p. 64 (hereinafter referred to as Cited Reference 2), shows a configuration method of a pass transistor circuit which uses a logic expression called as a binary decision diagram.

DISCLOSURE OF THE INVENTION

In recent LSI circuit designing practice, automatic designing methods using gate arrays, standard cells, FPGA (field programmable gate arrays), PLA (programmable logic arrays), etc. are in widespread use.

As the number of elements which can be integrated in an LSI has increased significantly, it has become practically impossible for engineers to design manually such large scale and complex logic circuits.

FIG. 13(a) shows a concrete example of standard cell scheme for automatic designing of a logic LSI. In this example, circuits (1304, 1305, 1306) having certain functions and already layouted, called as cells (1301, 1302, 1303) are prepared. The LSI has logic circuit areas (1307, 1309, 1311) and interconnected as required over routing areas (1308, 1310), and wirings are formed over cells, if necessary, to attain a desired logic.

As for so-called "macro" circuits having high regularity such as arithmetic circuits and memories, small-scale blocks are designed manually and these blocks are arranged regularly. In most designing practice of a LSI chip, the macro circuits thus designed are often combined with portions designed by the standard cell scheme or other automatic designing scheme except for a case of designing a specific LSI chip dedicated for an arithmetic unit or a memory. An example of this kind of LSI is shown in FIG. 13(b).

It is desirable that LSI circuits have reduced circuit area, higher speed in operation and lower consumption in power. Therefore, any of various circuit schemes satisfying these requirements as much as possible is to be selected. In selection of a circuit scheme on the premise of automatic designing, however, only such requirements as good circuit performance, small circuit area and lower power consumption are insufficient. That is, automatic designing techniques including logic synthesis technique, automatic layout technique, etc. for supporting a selected circuit scheme must be established.

At present, automatic designing techniques field-proven for CMOS circuits using N-channel and P-channel field effect transistors in complementary arrangement and have been adopted prevalently in development of microprocessors, etc.

On the other hand, a pass transistor circuit scheme is known as an advantageous approach for forming circuits having high speed, small area and low power consumption. As to automatic designing technology for using the pass transistor circuit scheme, a logic circuit configuration method such as disclosed in cited Reference 2 is available. In the pass transistor circuit scheme, a given logic function is transformed into a logical expression using a binary decision diagram, nodes in the diagram are further transformed into selectors comprised of pass transistors, and then buffers are inserted to produce a logic circuit (called as a pass transistor logic circuit). FIG. 12 shows a pass transistor logic circuit configuration procedure and an example of a logic circuit configured thereby. Since a circuit configuration procedure has been clearly shown, even a highly complex logic circuit is undoubtedly realizable with pass transistors. This signifies that the pass transistor circuit scheme is advantageously applicable to automatic designing of LSIs.

As mentioned above, in designing large scale and complex logic LSIs, there is a close relationship between circuit schemes and automatic designing techniques, and both can be put into practice only after both are available. In consideration of this condition, the pass transistor circuit configuration method disclosed in Cited Reference 2 is advantageous with respect to an aspect of circuit area, power consumption and performance and an aspect of automatic designing.

However, the present inventor's analysis of a pass transistor logic circuit configured by the method shown in Cited Reference 2, has revealed that since the configured pass transistor logic circuit inherits features of binary decision diagrams, only a source input is applicable as an input from another pass transistor circuit to each pass transistor circuit included in the pass transistor logic circuit.

That is, as a gate input to each pass transistor in the configured pass transistor logic circuit, an input signal of a relevant logic function (or its inverted signal) is applied directly in any case. In this respect, the present inventors have found that there are two problems mentioned below.

The first problem is as follows: In the worst case of this circuit scheme, a signal must go through a number of stages of pass transistors which stages are proportional to the number of input signals on which the output logic depends, causing an increase in delay time.

The second problem is as follows; Since intrinsically shareable logic are arranged individually, the number of circuit elements is increased.

Therefore, the present inventors have proposed to add a signal supplying scheme in which an output signal from another pass transistor circuit is also used as a gate input of a transistor in a pass transistor circuit, in addition to an input signal of a relevant logic function (or its inverted signal). This makes it possible to provide improvements in the number of elements, delay time, circuit area and power consumption, thereby enabling implementation of more complex circuit logic. Examples of circuits arranged in the above-mentioned scheme are shown in FIGS. 4(a) and (b) and 5(a) and (b).

FIGS. 4(a) and (b) show the first problem that delay time increases. In both the circuits shown in FIGS. 4(a) and 4(b), the same logic function is implemented (OUT= A·B·D·E·G·H+A·B·DN·F+A·B·EN·F+AN·C+BN·C, where 'AN', etc. represents a negation signal of 'A', etc.). The circuit shown in FIG. 4(a) has been formed using the conventional designing method presented in Cited Reference 2. In this circuit, delay time of output 401 is defined as a period of time to be taken from the moment a signal is applied to input 402 until it reaches the output through path 403. As indicated in this Figure, the signal must go though five stages of pass transistor 404 to 408.

The circuit shown in FIG. 4(b) has been formed using the semiconductor integrated circuit designing method in accordance with the present invention. In this circuit, delay time of output 409 is defined as a period of time to be taken from the moment a signal is applied to input 410 until it reaches the output through path 411. As indicated in this Figure, the signal has only to go through just three stages of pass transistors 412 to 414. In general, a delay time increases with an increase in the number of pass transistor stages which a signal goes through. It is therefore understood that reduction in delay time is not sufficient in the circuit shown in FIG. 4(a), which has been formed using the conventional designing method.

FIGS. 5(a) and (b) show the second problem that since intrinsically shareable logic components are arranged individually, the number of elements increases, thereby to increase occupied area in the chip and power consumption.

In both the circuits shown in FIGS. 5(a) and (b), the same logic function is implemented (OUT1=A·B·G·H+AN·C+BN·C, OUT2=A·B·G·H+AN·D+BN·D, OUT3=A·B·G·H+AN·E+BN·E, OUT4=A·B·G·H+AN·F+BN·F).

The circuit shown in FIG. 5(a) has been formed using the conventional designing method presented in Cited Reference 2. In this circuit, parts 501 to 504 have the same configuration. Although these parts are intrinsically shareable, they are arranged individually and 24 transistors are provided in total.

The circuit shown in FIG. 5(b) has been formed using the semiconductor integrated circuit designing method in accordance with the present invention. In this circuit, the intrinsically shareable parts in FIG. 5(a) are arranged as a shared part 505, resulting in a total of 18 transistors. That is, the total number of transistors in FIG. 5(b) is smaller than that in FIG. 5(a) by 6. In general, as the number of transistors increases, there is a tendency of increasing circuit area and power consumption. It is therefore understood that reduction in circuit area and power consumption is not sufficient in the circuit shown in FIG. 5(a), which has been formed using the conventional designing method.

Accordingly, it is an object of the present invention to provide a semiconductor integrated circuit logic designing method to realize logic circuits which are superior to conventional pass transistor circuits in an operation speed, integration scale and power consumption in designing logic circuits comprised of pass transistors and having logic functions, by using an automatic designing device.

It is another object of the present invention to provide an automatic designing device for generating semiconductor integrated logic circuits, to realize logic circuits which are superior to conventional pass transistor circuits in an operation speed, integration scale and power consumption.

To carry out the objects, a logic circuit designing method according to the present invention (refer to FIGS. 1, 3(a) and (d) and 11) is a method of designing a logic circuit to be integrated on semiconductor, as implemented by using a designing device (1101) comprising a central processing unit, a memory device and a man-machine interface device, and is characterized in that a program stored in the memory device executes the following steps.

(a) A step of having a circuit designer input logic functions (refer to 301 in FIG. 3(a)) which are for determining logic relationship between logic inputs and logic outputs and a target specification of delay times between the logic inputs and the logic outputs (refer to 101 in FIG. 1).

(b) A step of forming a binary decision diagram (refer to FIG. 3(b)) as defined in the following paragraph (b-1) for at least part of inputted logic functions (refer to 102 in FIG. 1).

(b-1) The binary decision diagram is one formed by combining a plurality of nodes (306) each having a control variable (302), two input edges (303, 304) and one output (305), wherein the control variable of each node represents a logic input (A) to a relevant logic portion, either one of the two input edges of each node is selected according a logical value of the control variable, and a signal applied to the selected input edge is transferred to the output of the node (refer to FIG. 3(b)).

(c) A step of replacing at least part of a plurality of nodes in the binary decision diagram formed in the step (b) or in a diagram formed in the subsequent step (e), with a pass transistor circuit (refer to FIG. 3(d)) as defined in the following paragraph (c-1) (refer to 103 in FIG. 1).

(c-1) The pass transistor circuit (323) comprises a control input (324), a first input (325), a second input (326), an output (327), a first field effect transistor (328) having a source-drain path connected between the first input and the output, and a second field effect transistor (329) having a source-drain path connected between the second input and the output, wherein a gate of the first field effect transistor (328) responds to a signal applied to the control input (A), a gate of the second field effect transistor (329) responds to an inverted signal of the signal applied to the control input (A), and a signal of either one of the first input and the second input is transferred to the output (refer to FIG. 3(d)).

(d) A step of checking whether simulated delay time of the pass transistor circuit obtained in the step (c) meets the target specification given in the step (a), and executing the following steps (e), (f) and (g), if the specification is not met (refer to 104 in FIG. 1).

(e) A step of replacing at least plural nodes (refer to FIG. 3(b)) in the binary decision diagram with one replacing node (refer to FIG. 3(c)) so that conditions indicated in the following paragraphs (e-1) and (e-2) are satisfied (refer to 105 in FIG. 1).

(e-1) An external group of tips of input edges of the replacing nodes, of the diagram after the replacing (refer to 312, 313 and 314 in FIG. 3(c)) coincides with an external group of tips of input edges of relevant plural nodes, of the binary decision diagram before the replacing (refer to 308, 309 and 310 in FIG. 3(b)).

(e-2) A signal of the control variable of the replacing node in the diagram after the replacing is logical combination of plural signals for control variables of relevant plural nodes in the binary decision diagram before the replacing, so that a condition is kept that logic functions of the binary decision diagram after the replacing are identical to logic functions of the binary decision diagram before the replacing.

(f) A step of replacing at least part of nodes in the diagram after the replacing in the step (e) with the pass transistor circuit (refer to FIG. 3(d)), using the procedure in the step (c), so that the following signal supplying schemes are adopted.

With first, second and third pass transistor circuits defined in the paragraph (c-1) in relation to one replacing node after the replacing in the diagram after the replacing, a first signal supplying scheme is adopted between the first and the second pass transistor circuits, in which an input signal applied to a control input of one pass transistor circuit (322) is a signal of an output of other pass transistor circuit (323), and a second signal supplying scheme is adopted between the second and the third pass transistor circuits, in which an input signal applied to either one of the first input and the second input of one pass transistor circuit (322) is a signal of an output of other pass transistor circuit (321) (refer to FIG. 3(*d*)).

(g) A step of checking whether simulated delay time with the pass transistor circuit obtained in the step (f) meets the target specification given in the step (a) by using procedure in the step (d).

To carry out the objects, another logic circuit designing method according to the present invention (refer to FIGS. 2, 8 and 11) is a method of designing a logic circuit to be integrated on semiconductor, as implemented by using an automatic designing device (1101) comprising a central processing unit, a memory device and a man-machine interface device, and is characterized in that a program stored in the memory device executes the following steps.

(a) A step of having logic functions (refer to 801 in FIG. 8(*a*)) being inputted which are for determining logic relationship between logic inputs and logic outputs and a target specification of at least one of an occupied area in a chip and power consumption of the logic circuit (refer to 201 in FIG. 2).

(b) A step of forming a binary decision diagram (refer to FIG. 8(*b*)) as defined in the following paragraph (b-1) for at least part of the logic functions as given by a designer (refer to 202 in FIG. 2).

(b-1) The binary decision diagram is one formed by combining a plurality of nodes each having a control variable (302), two input edges and one output, wherein the control variable of each node represents a logic input to a relevant logic portion, either one of the two input edges of each node is selected according a logical value of the control variable, and a signal applied to the selected input edge is transferred to the output of the node.

(c) A step of replacing at least part of a plurality of nodes in the binary decision diagram formed in the step (b) or in a diagram formed in the subsequent step (e), with a pass transistor circuit (refer to FIG. 8(*d*)) as defined in the following paragraph (c-1) (refer to 203 in FIG. 2).

(c-1) The pass transistor circuit comprises a control input, a first input, a second input, an output, a first field effect transistor having a source-drain path connected between the first input and the output, and a second field effect transistor having a source-drain path connected between the second input and the output, wherein a gate of the first field effect transistor responds to a signal applied to the control input, a gate of the second field effect transistor responds to an inverted signal of the signal applied to the control input, and a signal of either one of the first input and the second input is transferred to the output.

(d) A step of checking whether at least one of a simulated occupied area and simulated power consumption of the pass transistor circuit obtained in the step (c) meets the target specification given in the step (a), and executing the following steps (e), (f) and (g), if the specification is not met (refer to 204 in FIG. 2).

(e) A step of replacing at least plural groups of nodes in the binary decision diagram with replacing nodes (refer to 817, 818, 819 and 820 in FIG. 8(*c*)) and a group of shared nodes (refer to 825 in FIG. 8(*c*)) so that conditions indicated in the following paragraphs (e-2) and (e-3) are satisfied (refer to 205 in FIG. 2).

(e-1) Each node group within plural node groups before the replacing (refer to 805, 806, 807 and 808 in FIG. 8(*b*)) comprises a plurality of nodes, wherein a mutual coupling form and an input signal for a control variable of the plural node groups before the replacing is identical to each other.

(e-2) An output of a group of shared nodes (refer to 825 in FIG. 8(*c*)) is applied as a control variable for plural replacing nodes after the replacing (refer to 817, 818, 819, and 820 in FIG. 8(*c*)), so that a condition is kept that logic functions of the binary decision diagram after the replacing are identical to logic functions of the diagram before the replacing, wherein the group of shared nodes (refer to 825 in FIG. 8(*c*)) corresponds to the plural nodes (refer to 805, 806, 807 and 808 in FIG. 8(*b*)) among which the mutual coupling form before the replacing and an input signal for a control variable are identical to each other.

(e-3) An external group of tips of input edges of plural replacing nodes (refer to 817, 818, 819 and 820 in FIG. 8(*c*)), of the diagram after the replacing (refer to FIG. 8(*c*)) coincides with an external group of tips of input edges of relevant plural groups of nodes (refer to 805, 806, 807 and 808 in FIG. 8(*b*)), of the binary decision diagram before the replacing (refer to FIG. 8(*b*)).

(f) A step of replacing at least part of nodes in the diagram after the replacing in the step (e) with pass transistor circuit s(refer to FIG. 8(*d*)), by using the procedure in the step (c), so that the following signal supplying schemes are adopted.

With first, second and third pass transistor circuits defined in the paragraph (c-1) in relation to plural replacing nodes after the replacing in the diagram after the replacing (refer to 817, 818, 819 and 820 in FIG. 8(*c*)), a first signal supplying scheme is adopted between the first and the second pass transistor circuits, in which an input signal applied to a control input of one pass transistor circuit (840, 841) is a signal of an output of other pass transistor circuit (844, 845), and a second signal supplying scheme is adopted between the second and the third pass transistor circuits, in which an input signal applied to either one of the first input and the second input of one pass transistor circuit (840, 841) is a signal of an output of other pass transistor circuit (842, 843) (refer to FIG. 8(*d*)).

(g) A step of checking whether at least either one of a simulated occupied area in the chip and simulated power consumption with the pass transistor circuit obtained in the step (f) meets the target specification given in the step (a) by using procedure in the step (d).

In accordance with the present invention as mentioned above, it is possible to implement more complex logic, by adding a signal supplying scheme in which an output signal from another pass transistor circuit is also applied as a transistor gate input of a pass transistor circuit in addition to an input signal (or its inverted signal) of a target logic function. It is further possible to automatically design semiconductor integrated logic circuits meeting target specifications such as delay time, an occupied area in the chip, power consumption etc. through use of an automatic designing device. Therefore, the foregoing objects of the invention can be accomplished.

The other objects and features of the present invention will become apparent from the following embodiments.

BRIEF DESCRIPTION OF THE DRAWINGS

FIG. 1 is a flowchart 1 showing a logic circuit designing method according to a preferred embodiment of the present invention;

FIG. 2 is a flowchart 2 showing a logic circuit designing method according to another preferred embodiment of the present invention;

FIGS. 3(a), 3(b), 3(c) and 3(d) show the procedure of a logic circuit designing method of the present invention and a circuit generated thereby;

FIGS. 6(a), 6(b) and 6(c) show the procedure of a conventional designing method and an example of circuit generated thereby;

FIGS. 7(a), 7(b) and 7(c) show the procedure of a conventional designing method and an example of circuit generated thereby;

FIGS. 8(a), 8(b), 8(c), 8(d) and 8(e) show the procedure of a designing method according to the present invention and an example of circuit generated thereby;

FIGS. 9(a), 9(b), 9(c), 9(d), 9(e), 9(f), 9(g) and 9(h) show the procedure of a logic circuit designing method of the present invention to 16 input logical AND function and an example of circuit generated thereby;

FIG. 10 is a truth table showing the logic function indicated in FIG. 8(d);

BEST MODES FOR CARRYING OUT THE INVENTION

Referring to FIG. 1, there is shown a logic circuit designing method for a semiconductor integrated circuit according to an embodiment of the present invention.

Figure 11:
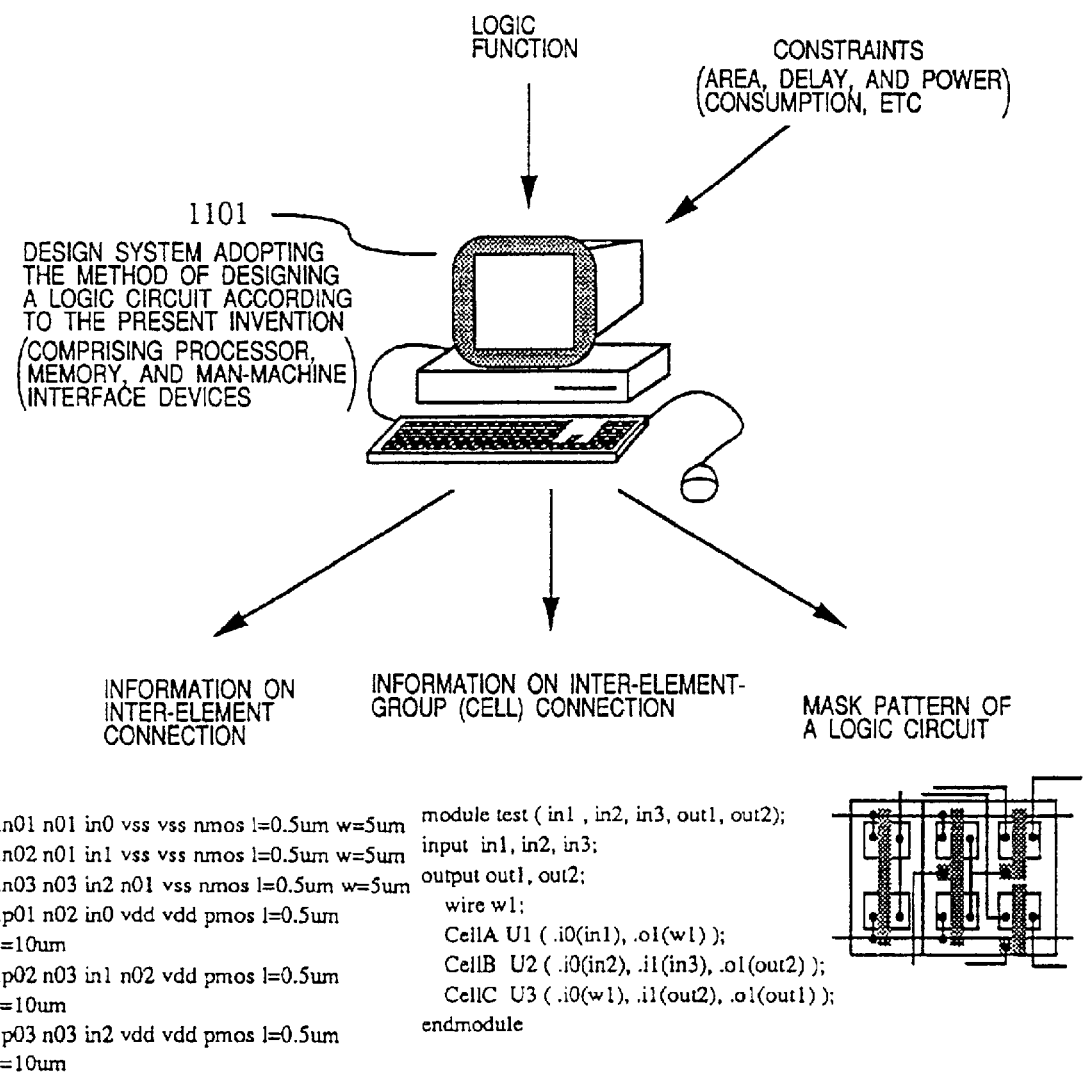
FIG. 11 shows a logic circuit designing device according to an embodiment of the present invention.
Figure 12:
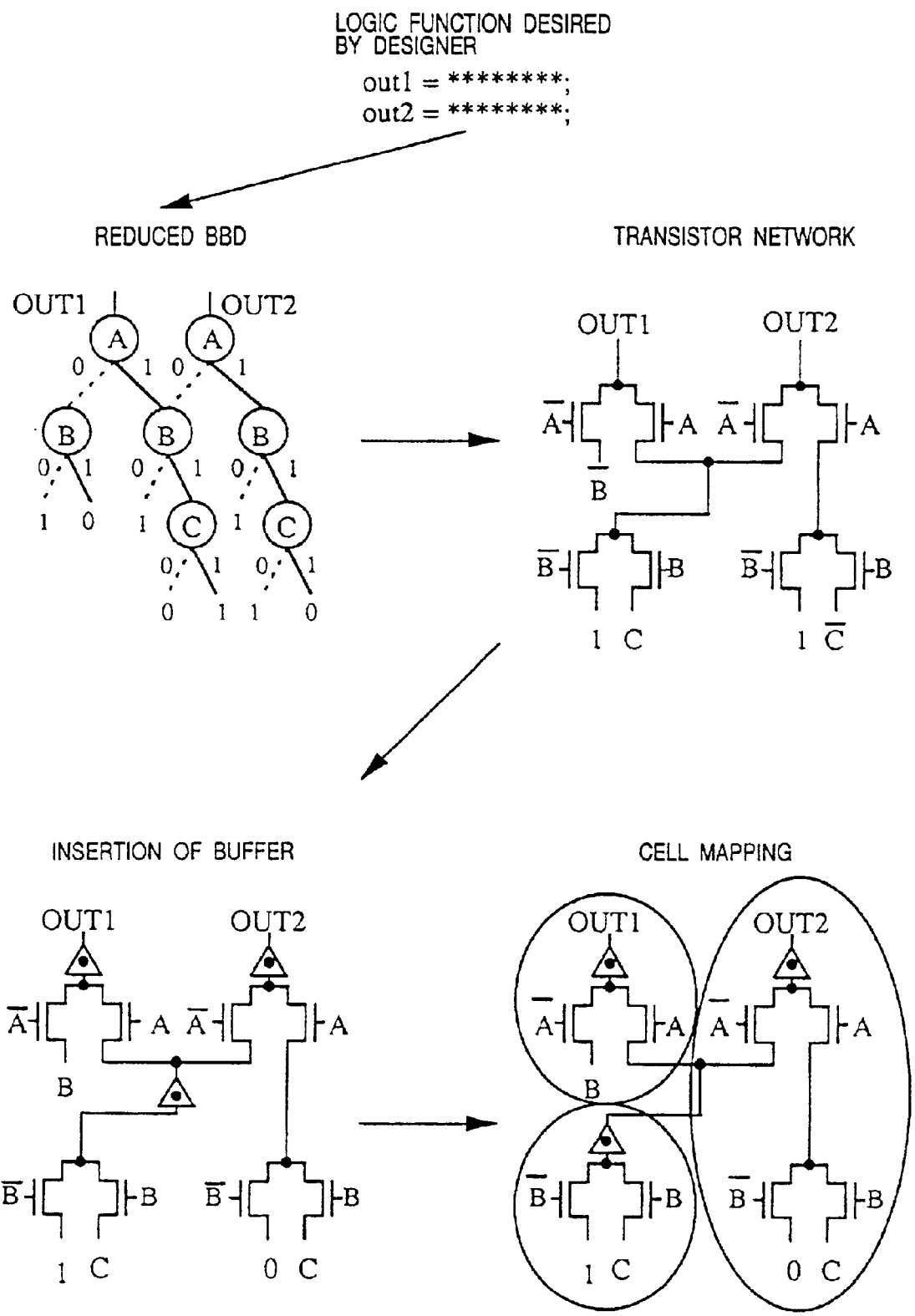
FIG. 12 shows the procedure of a conventional designing method.
Figure 13A:
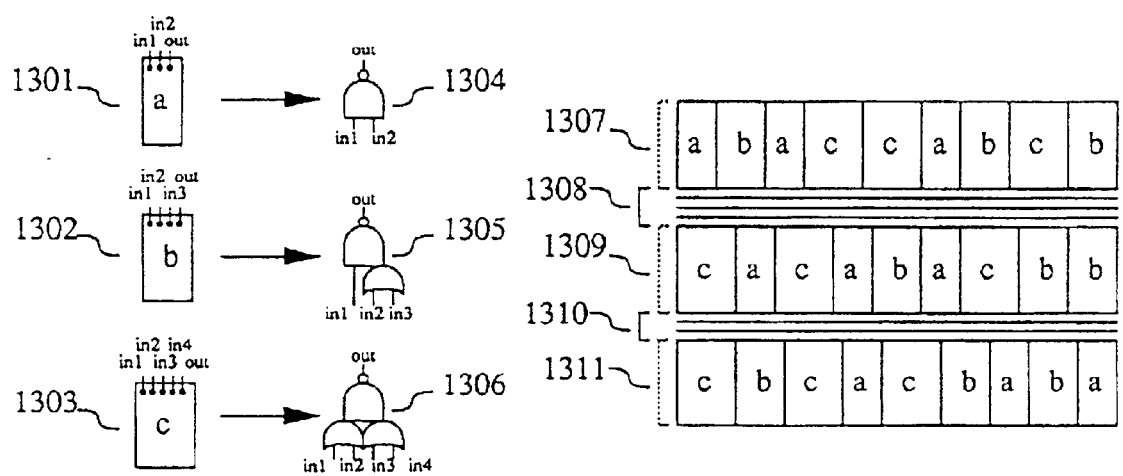
FIGS. 13(a) and 13(b) show an example of a logic LSI automatically designed according to an embodiment of the present invention.
Figure 13B:
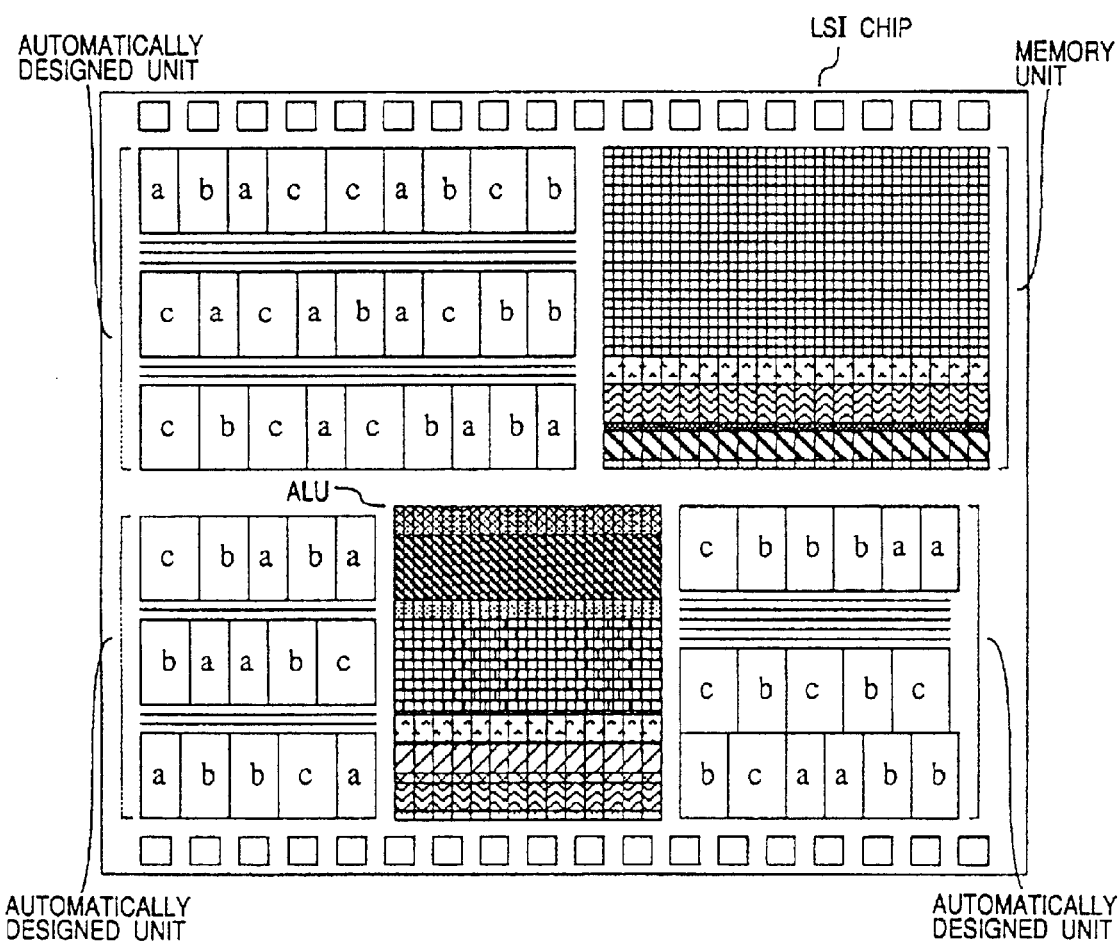

The design method according to this embodiment is a method of designing a logic circuit to be integrated on a semiconductor, as implemented by using an automatic designing device (1101) shown in FIG. 11, which comprises a central processing unit (CPU) (not shown), a memory device (including a main memory, hard disk storage, etc.) (not shown) and a man-machine interface devices (including a keyboard, display monitor, touch-sensitive panel, etc.) (not shown). The method has feature that a program held in the memory device (not shown) of the automatic designing device (1101) executes the following steps and automatically designs a logic circuit to be integrated on semiconductor.

Step 101 in FIG. 1: In this step 101, (a) a logic function for determining logic relationship between logic inputs and logic outputs as shown by 301 in FIG. 3(a) and a design target specification of delay time between the inputs and the outputs are inputted by a designer.

Step 102 in FIG. 1: In this step 102, (b) a binary decision diagram defined in the following step (b-1) as shown in FIG. 3(b) is formed for at least part of the logic functions given by the designer.

Figure 3B:
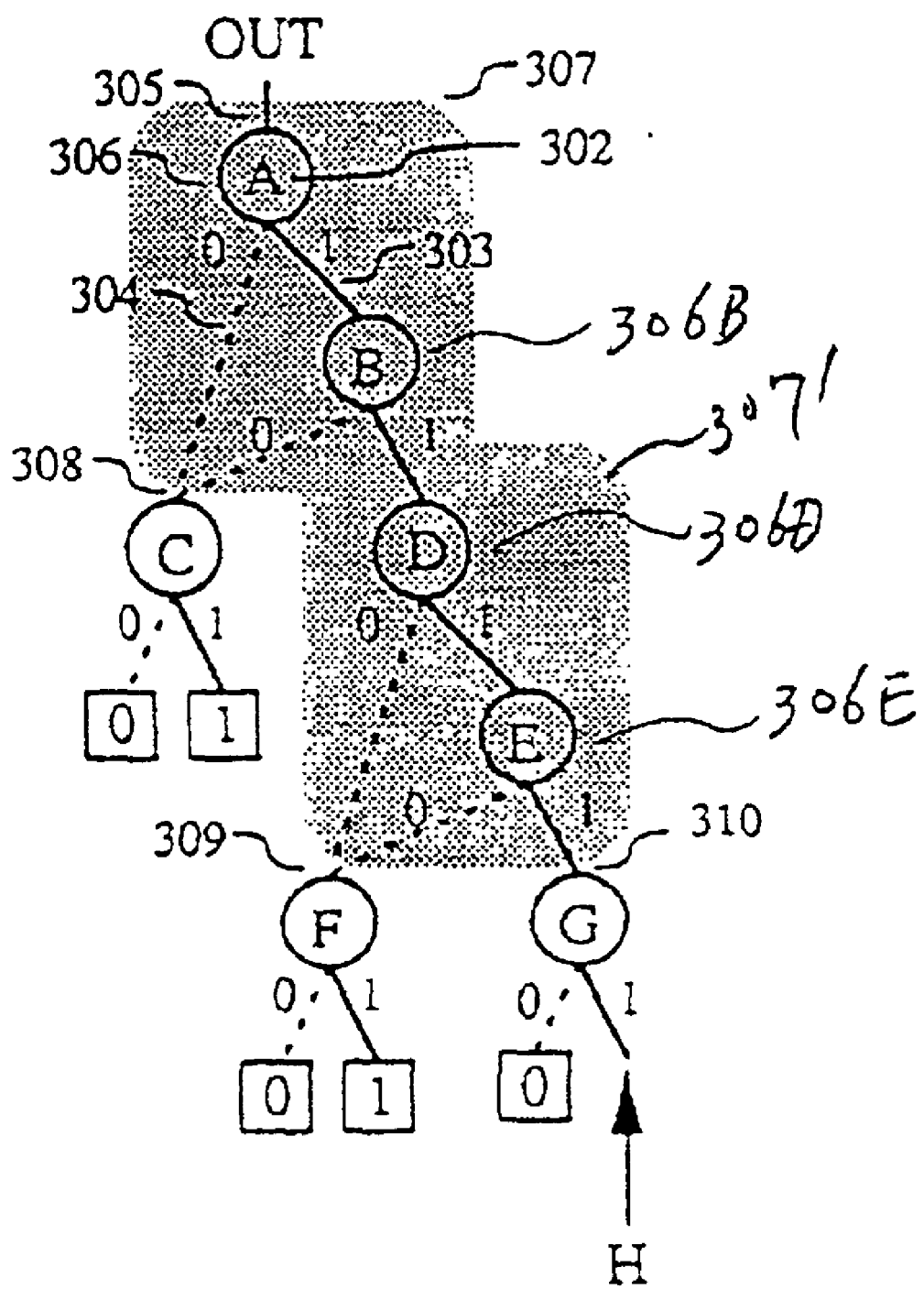

(b-1) The binary decision diagram is generated by combining a plurality of nodes (306) 306B, 306D, 306E and 308 to 310 each having a control variable (302), two input edges (303, 304) and one output (305) as shown in FIG. 3(b), wherein a control variable of each node represents a logic input (A) to a relevant logic part, either one of two input edges of each node is selected according to a logic value of the control variable, and a signal applied to the selected input edge is transferred to the output of each node.

Step 103 in FIG. 1: In this step 103, (c) at least part of nodes in the binary decision diagram formed in the above step 102 or in a diagram formed in the wherein each pass transistor circuit is defined in the following paragraph (c-1) and shown by the circuit 323 in FIG. 3(d).

Figure 3C:
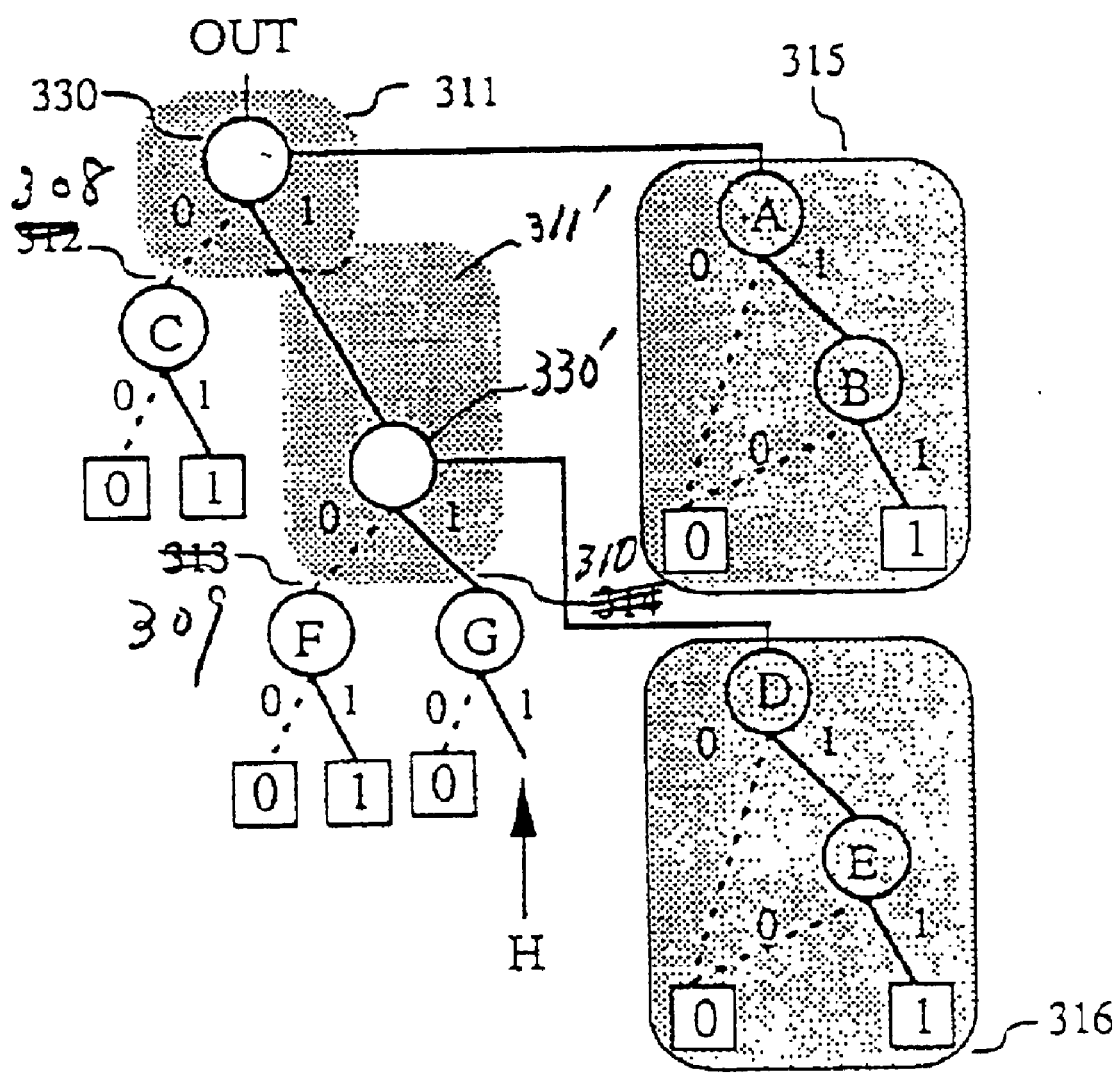
Figure 3D:
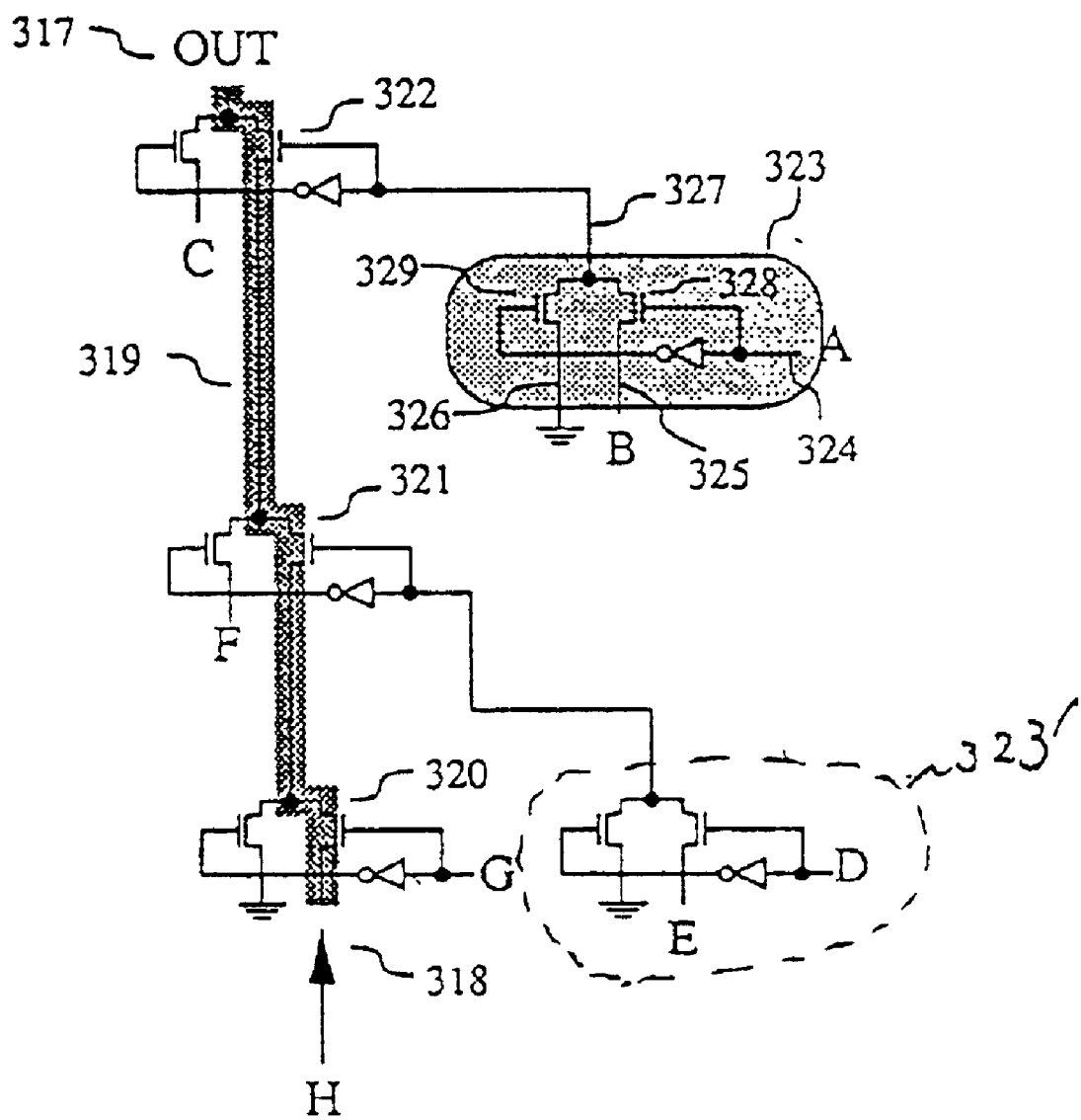
Figure 4A:
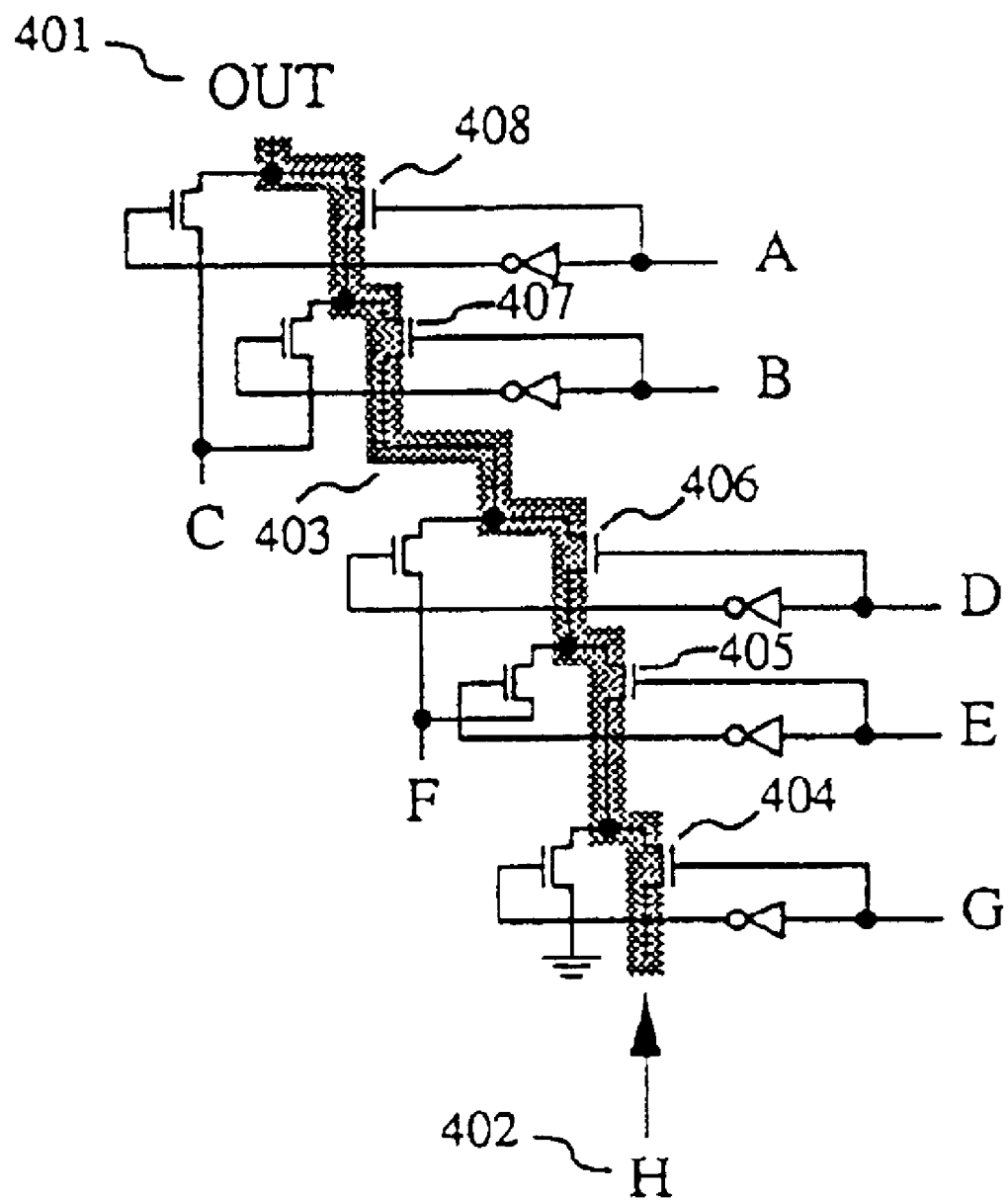
FIGS. 4(a) and 4(b) compare a circuit generated in a conventional method and a circuit generated according to the present invention.
Figure 4B:
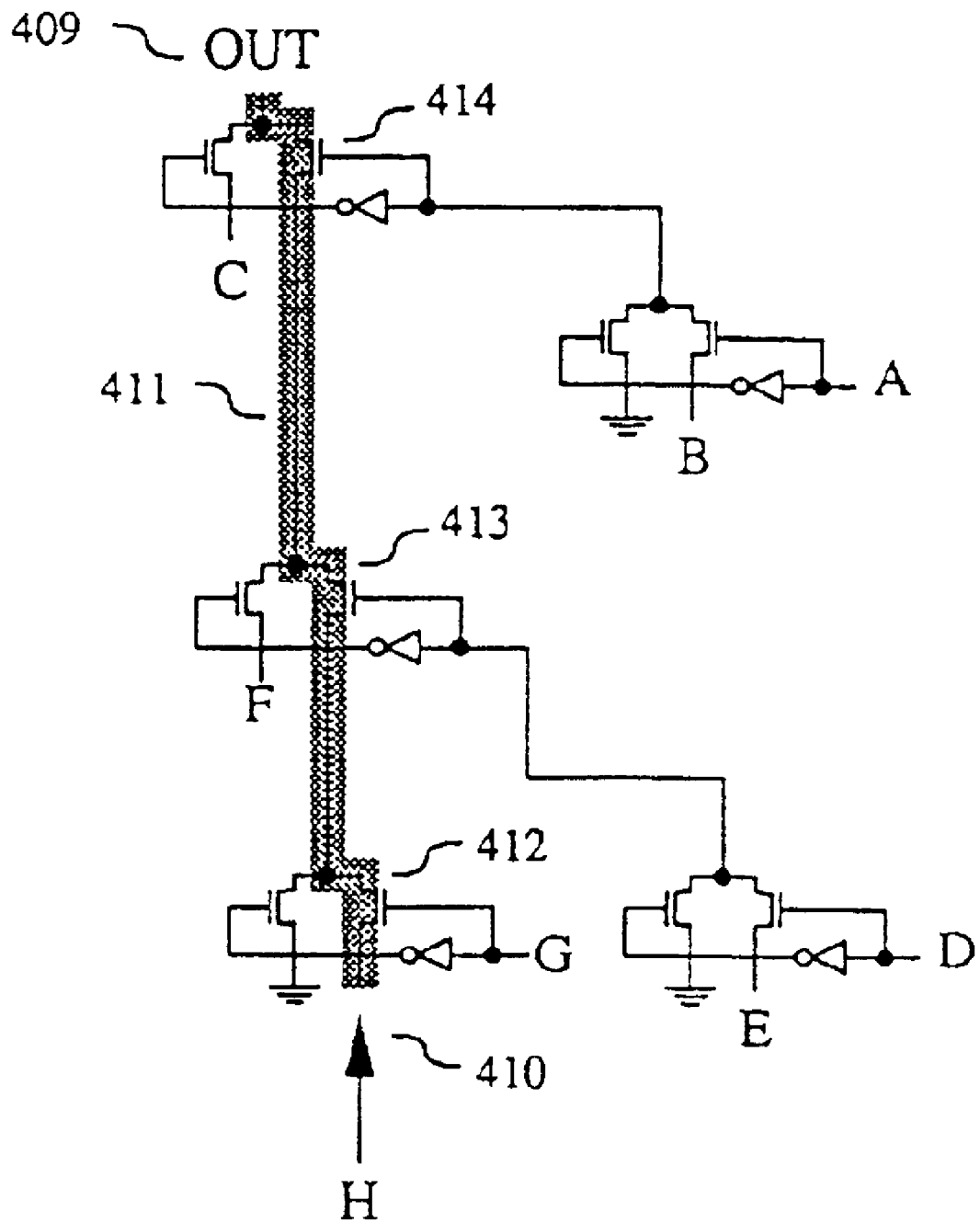
Figure 5A:
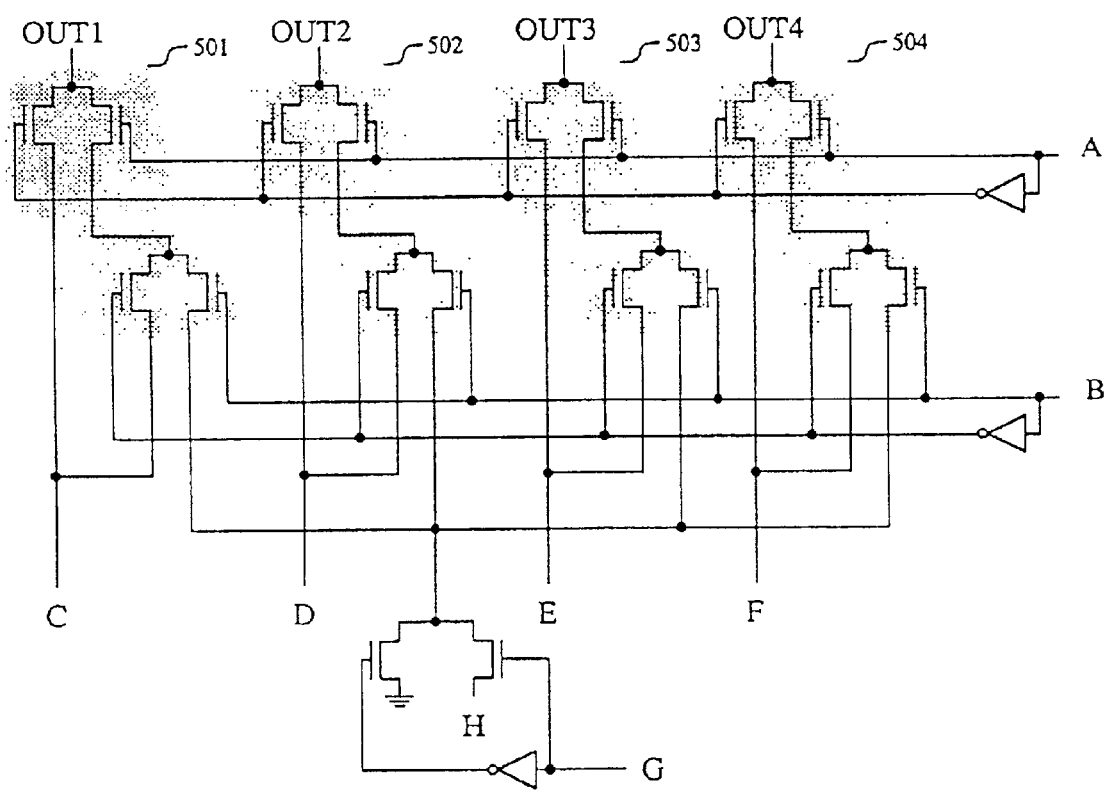
FIGS. 5(a) and 5(b) also compare a circuit generated according to a conventional method and a circuit generated according to the present invention.
Figure 5B:
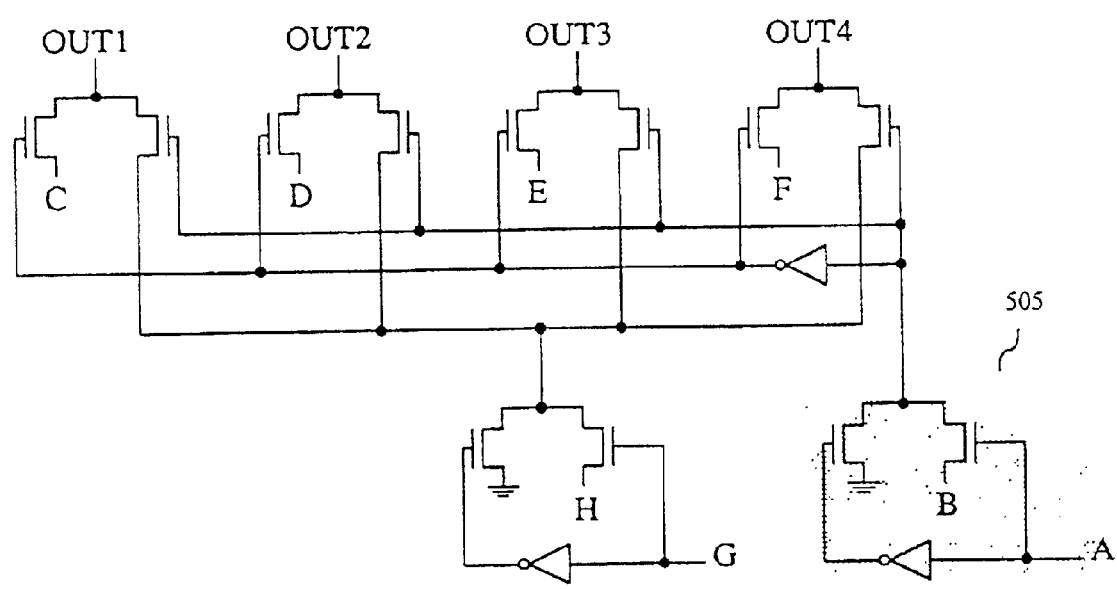

(c-1) The pass transistor circuit (323) comprises a control input (324), a first input (325), a second input (326), an output (327), a first field effect transistor (328) having a source-drain path connected between the first input and the output, and a second field effect transistor (329) having a source-drain path connected between the second input and the output, as shown in FIG. 3(d), wherein a gate of the first field effect transistor (328) responds to a signal applied to the control input (A), a gate of the second field effect transistor (329) responds to an inverted signal of the signal applied to the control input (A), and a signal from either one of the first input and the second input is transferred to the output (refer to the circuit 323 in FIG. 3(d)).

Step 104 in FIG. 1: In this step 104, (d) it is checked whether simulated delay time of the pass transistor logic circuit (not shown) attained in the above step 103 (c) meets the target specification of delay time given in the above step (a). If the specification is not met, the target following steps (e), (f) and (g) are carried out (refer to 104 in FIG. 1).

Step 105 in FIG. 1: In this step 105, (e) at least plural nodes in the binary decision diagram formed in the above step 103 as shown in FIG. 3(b) are replaced with one replacing node as shown in FIG. 3(c), so that conditions indicated in the following paragraphs (e-1) and (e-2) are satisfied.

(e-1) An external group of tips of input edges of the replacing node, of the diagram after the replacing (refer to 312, 313 and 314 in FIG. 3(c)) coincides with an external group of tips of input edges of relevant plural nodes, of the binary decision diagram before the replacing (refer to 308, 309 and 310 in FIG. 3(b)).

(e-2) A signal for the control variable of the replacing node in the diagram after the replacing is a logic combination of plural signals for control variables (A, B) of relevant plural nodes in the binary decision diagram before the replacing so that the logic function of the diagram after the replacing as shown in FIG. 3(c) is identical to the logic function of the binary decision diagram before the replacing as shown in FIG. 3(b).

Step (f): In this step (f), at least part of nodes in the diagram after the replacing in the above step 105 (e) of step 105 in FIG. 1 are replaced with the pass transistor circuit (refer to FIG. 3(d)), by using the procedure in the above step 103 (c).

As a result, in the first, the second and the third pass transistor circuits defined in the above step (c-1) in relation to one replacing node in the diagram after the replacing, a first signal supplying scheme is adopted between the first and the second pass transistor circuits, in which an input signal applied to control input of one pass transistor circuit (322) is an output signal of the other pass transistor circuit (323), and a second signal supplying scheme is adopted between the second and the third pass transistor circuits, in which an input signal applied to either one of the first input and the second input of one pass transistor circuit (322) is an output signal of the other pass transistor circuit (321) as shown in FIG. 3(d).

Step (g): In this step (g), it is checked by using the procedure in the above step 104 (d) whether simulated delay time of the pass transistor circuit attained in the above step (f) meets the target specification given in the above step (a).

If the simulation delay time does not meet the target specification given in the above step 101 (a), the above steps (e), (f) and (g) are repeated.

Referring to FIG. 2, there is shown a logic circuit designing method for a semiconductor integrated circuit according to another embodiment of the present invention.

The design method according to this embodiment shown in FIG. 2 is also a method for designing a logic circuit to be integrated on semiconductor, similarly to the embodiment in FIG. 1, by using an automatic designing device (1101) shown in FIG. 11, which comprises a central processing unit (CPU), a memory device (including a main memory, hard disk storage, etc.) and a man-machine interface devices (including a keyboard, display monitor, touch-sensitive panel, etc.). The method has a feature that a program held in the memory device of the automatic designing device (1101) executes the following steps, and automatically designs a logic circuit to be integrated on semiconductor.

Step 201 in FIG. 2: In this step 201, (a) a logic function for determining logic relationship between logic inputs and logic outputs as shown by 801 in FIG. 8(a) and a target specification of at least either one of occupied area in the chip and power consumption of relevant logic circuit are inputted.

Figure 8B:
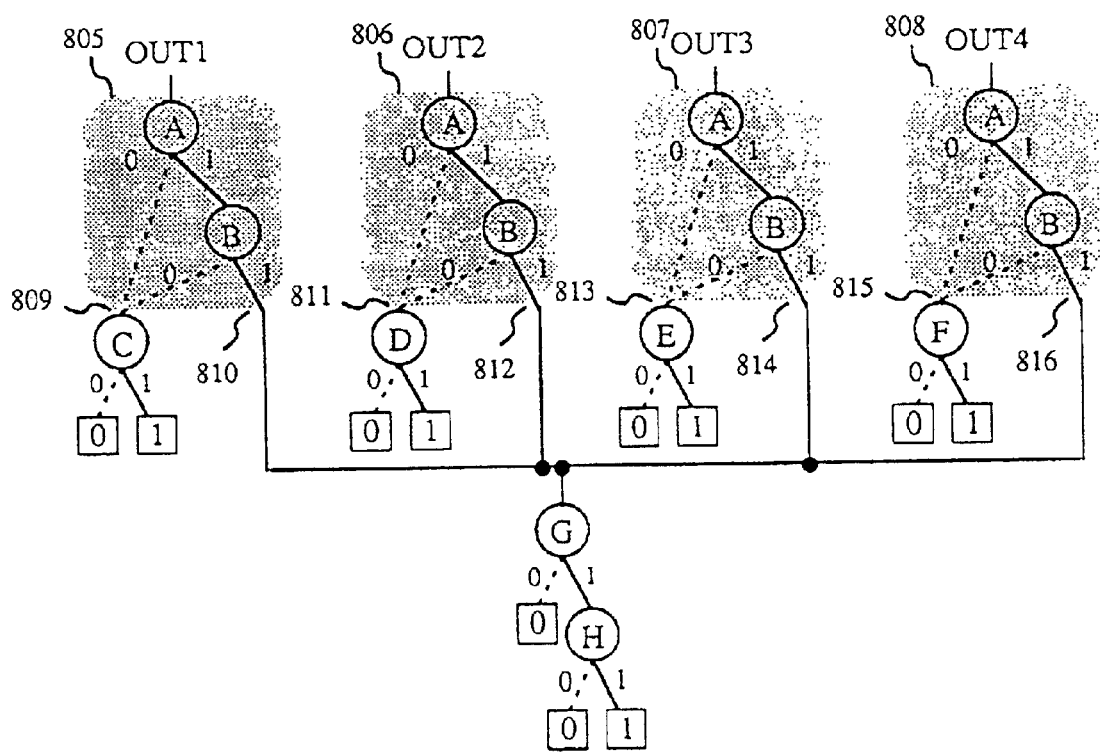

Step 202 in FIG. 2: In this step 202, (b) a binary decision diagram defined in the following step (b-1) as shown in FIG. 8(b) is prepared for at least part of the logic functions given by a designer. (b-1) The binary decision diagram is generated by combining a plurality of nodes each having a control variable (302) and two input edges and one output, wherein a control variable at each node represents a logic input to a relevant logic part, either one of the two input edges is selected according to a logic value of the control variable, and a signal applied to the selected input edge is transferred to the output of each node.

Step 203 in FIG. 2: In this step 203, (c) at least a part of nodes in the binary decision diagram formed in the above step 202 (b) or in a diagram formed in the subsequent step (e) are replaced with a pass transistor circuit defined in the following step (c-1) and shown in FIG. 8(d).

(c-1) The pass transistor circuit comprises a control input, a first input, a second input, an output, a first field effect transistor having a source-drain path connected between the first input and the output, and a second field effect transistor having a source-drain path connected between the second input and the output, wherein a gate of the first field effect transistor responds to a signal applied to the control input, a gate of the second field effect transistor responds to an inverted signal of the signal applied to the control input, and a signal from either one of the first input and the second input is transferred to the output.

Step 204 in FIG. 2: In this step 204, (d) it is checked whether at least either one of simulation values of occupied area in the chip and power consumption of the pass transistor circuit attained in the above step 203 (c) meets the target specification given in the above step 201 (a). If the specification is not met, the following steps (e), (f) and (g) are carried out.

Step 205 in FIG. 2: In this step 205, (e) at least plural node groups of nodes in the binary decision diagram formed in the above step 102 as shown by 805, 806, 807 and 808 in FIG. 8(b), which satisfy the condition indicated in the following paragraph (e-1), are replaced with replacing nodes as shown by 817, 818, 819 and 820 in FIG. 8(c) and a group of shared nodes as shown by 825 in FIG. 8(c) so that the conditions indicated in the following paragraphs (e-2) and (e-3) are satisfied.

(e-1) Each node group of plural node groups before the replacing (refer to 805, 806, 807 and 808 in FIG. 8(b)) comprises a plurality of nodes, and a mutual coupling form of plural node groups before the replacing and control variable input signals are identical to each other.

Figure 8C:
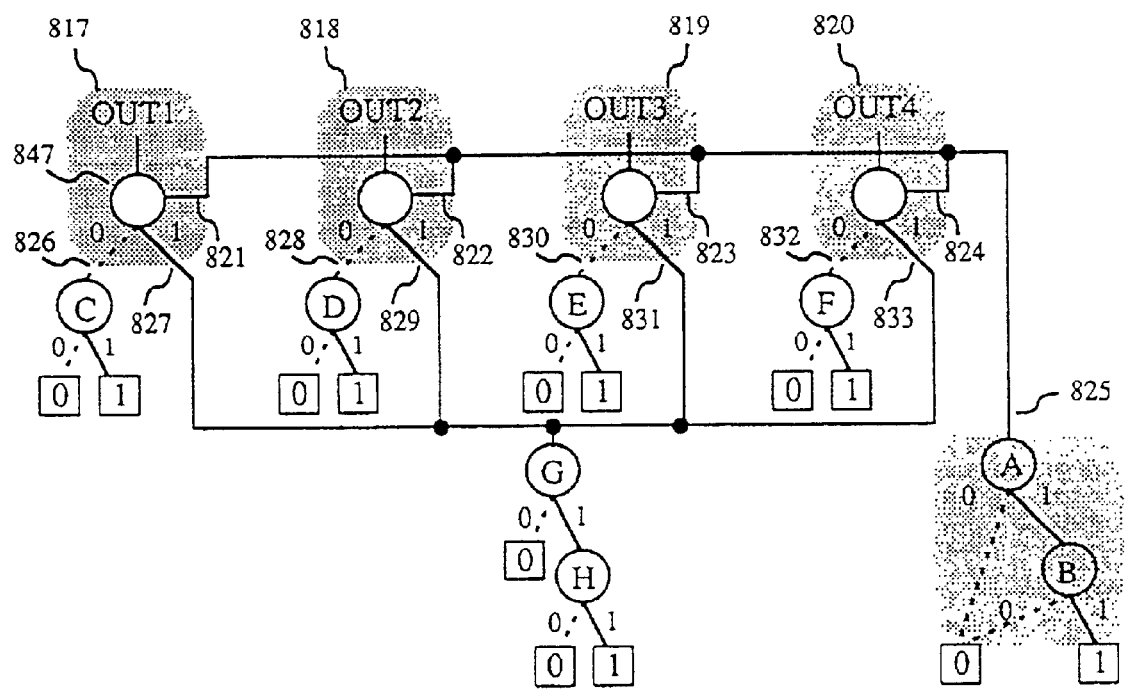

(e-2) An output of a group of shared nodes (refer to 825 in FIG. 8(c)) is applied, as control variables for plural nodes after the replacing (refer to 817, 818, 819 and 820 in FIG. 8(c)), so that the logic functions of the diagram after the replacing are kept identical with the logic functions of the binary decision diagram before the replacing, and the group of shared nodes (refer to 825 in FIG. 8(c)) corresponds to the plural nodes (refer to 805, 806, 807 and 808 in FIG. 8(b)) where the mutual coupling form before the replacing and an input signal for a control variable are identical with each other.

(e-3) An external group of tips of input edges of plural replacing nodes (refer to 817, 818, 819 and 820 in FIG. 8(c)), of the diagram after the replacing (refer to FIG. 8(c)) coincides with an external group of tips of input edges of relevant plural nodes (refer to 805, 806, 807 and 808 in FIG. 8(b)), of the binary decision diagram before the replacing (refer to FIG. 8(b)).

Step (f): In this step (f), at least part of nodes in the diagram after the replacing by the above step 205 (e) are replaced with the pass transistor circuit, by using the procedure in the above step 203 (c), so that the following signal supplying schemes are adopted.

Figure 8D:
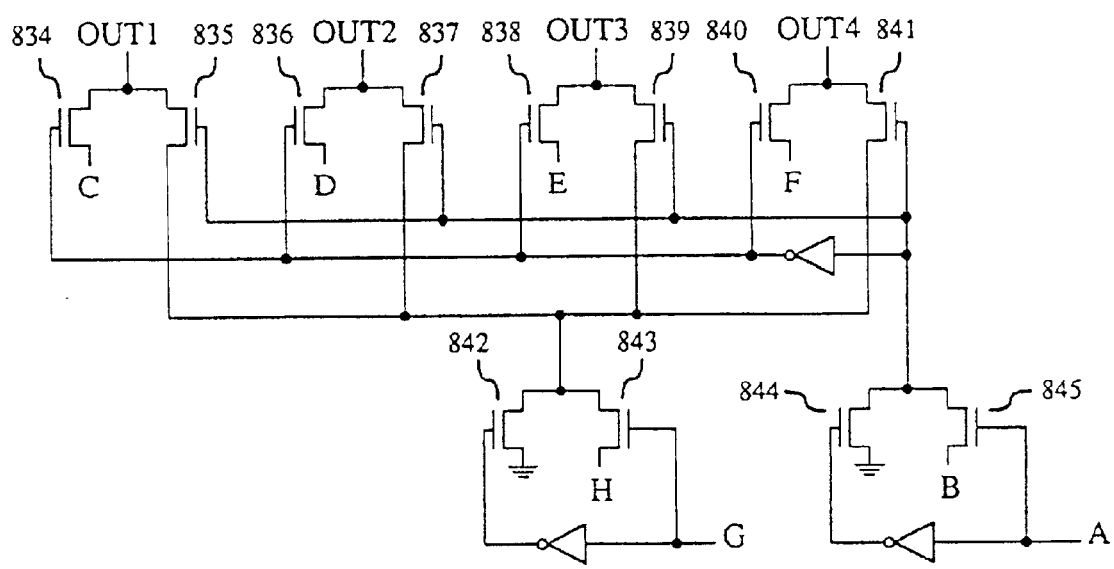

For the first, the second and the third pass transistor circuits defined in the above step (c-1) in relation to plural replacing node after the replacing (refer to 817, 818, 819 and 820 in FIG. 8(c)) in the diagram after the replacing, a first signal supplying scheme is adopted between the first and the second pass transistor circuits, in which an input signal applied to control input of a pair of pass transistor circuits (840, 841) is an output signal of another pass transistor circuits (844, 845), and a second signal supplying scheme is adopted between the second and third pass transistor circuits, in which an input signal applied to either one of the first input and the second input of a pair of pass transistor circuits (840, 841) is an output signal of another pass transistor circuits (842, 843) (refer to FIG. 8(d)).

Step (g): in this step (g), it is checked by using the procedure in the above step (d) whether a simulation value of at least either one of occupied area in the chip and power consumption of the pass transistor circuit attained in the above step (f) meets the target specification given in the above step (a).

If the simulation value of at least either one of occupied area in the chip and power consumption does not meet the target specification given in the above step 201 (a), the above steps (e), (f) and (g) are repeated.

The following describes principles that a pass transistor circuit configured by a designing method embodied in the present invention is higher in an operation speed, smaller in circuit area and lower in power consumption than those of a conventional circuit, with reference to FIGS. 3(a) to (d), 6(a) to (c), 7(a) to (c) and 8(a) to (e).

FIGS. 3(a) to (d) and 6(a) to (c) show the procedure of designing the same logic functions (301, 601) designed by a conventional method and a designing method according to the present invention, respectively.

Figure 6B:
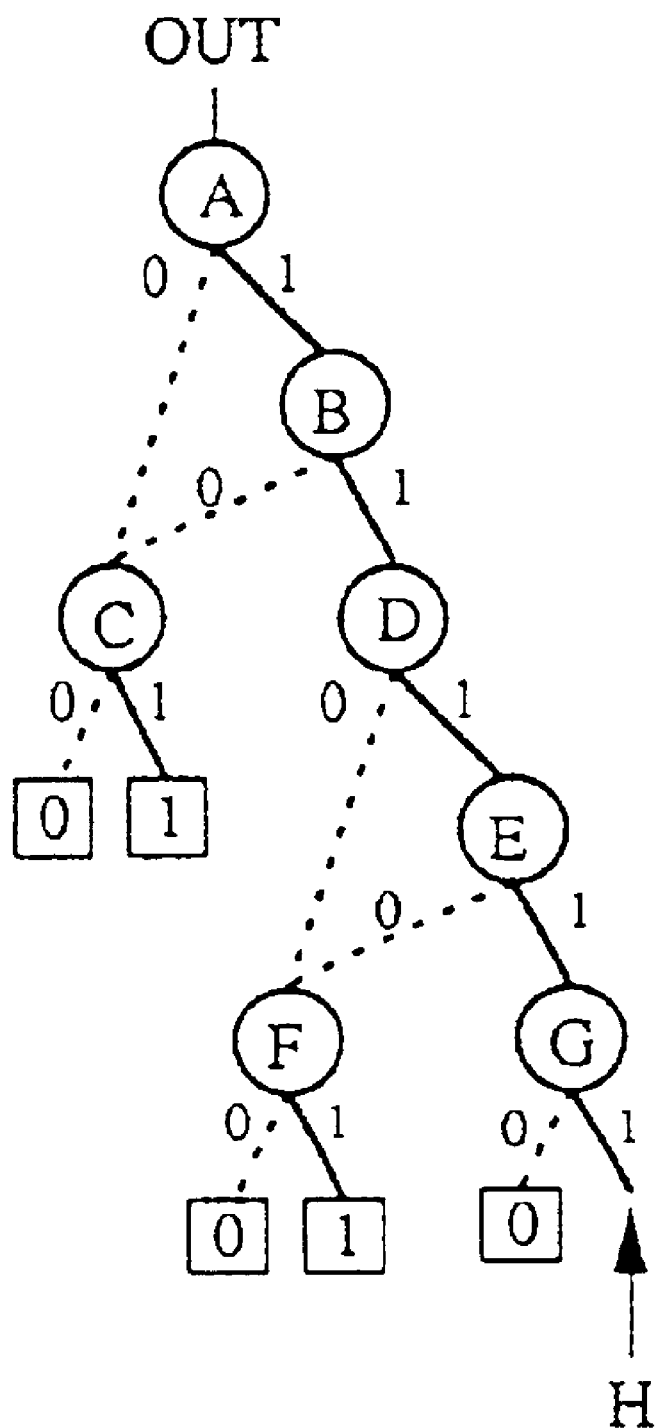
Figure 6C:
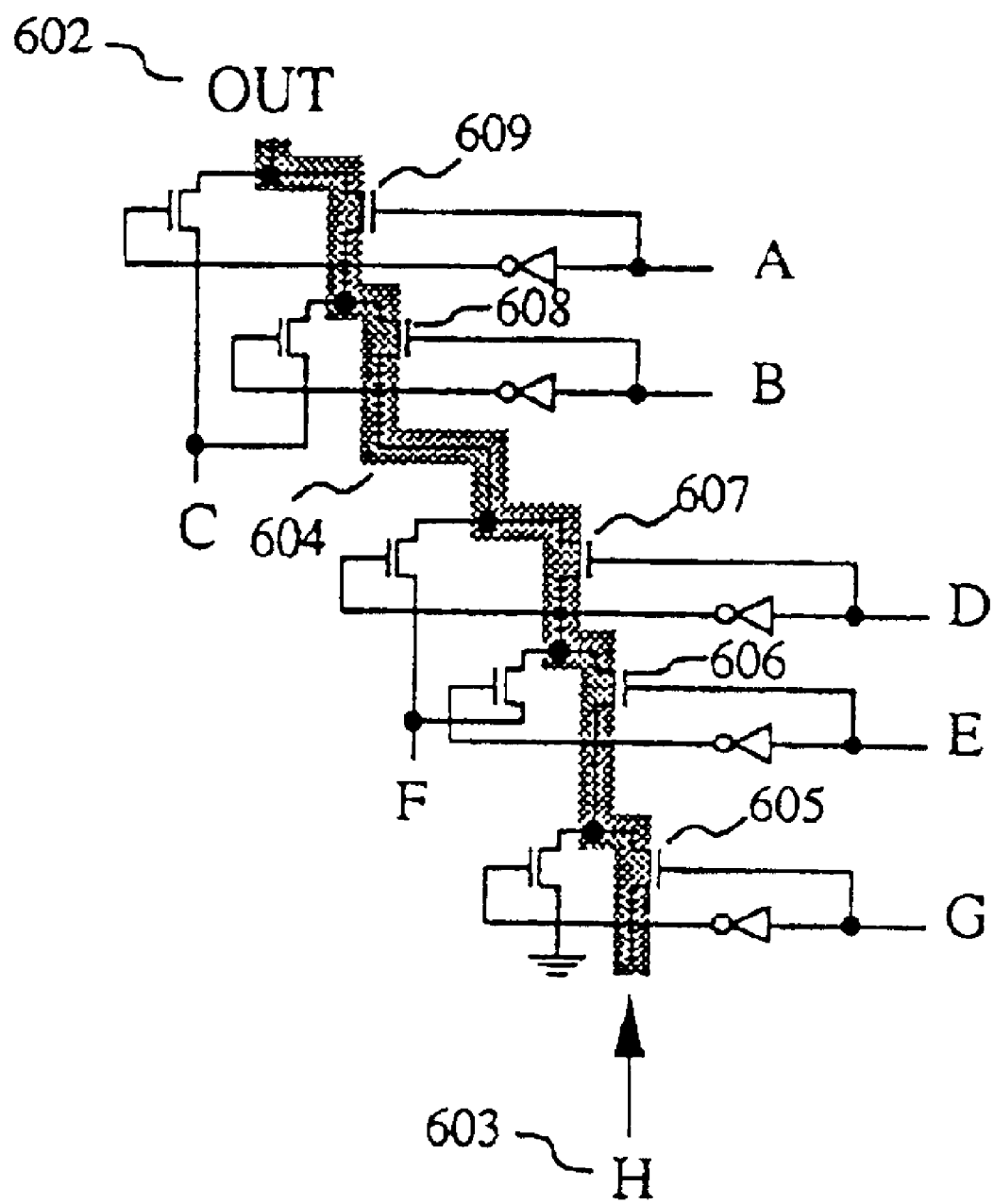

A circuit in FIG. 6(c) is formed using the configuration method disclosed in Cited Reference 2 in the order of FIGS. 6(a), 6(b) and 6(c). That is, a logic function (601) given in FIG. 6(a) is transformed into a binary decision diagram shown in FIG. 6(b). Each node in the binary decision diagram is further transformed into a selector comprised of pass transistors. Thus, a circuit shown in FIG. 6(c) is attained. In this circuit, if a transfer path of a signal imposing delay constraint (critical path) corresponds to a path (604) from input H (603) to output OUT (602), the signal must go through five stages of transistors (605, 606, 607, 608, 609) along the path.

On the other hand, a circuit formed by using the designing method of the present invention is shown in FIG. 3(d). The circuit is formed in the order of FIGS. 3(a), 3(b), 3(c) and 3(d). That is, a logic function (301) given in FIG. 3(a) is transformed into a binary decision diagram shown in FIG. 3(b). Then, a partial diagram (307) corresponding to a circuit not meeting a required specification on delay time is extracted from the binary decision diagram, and the extracted partial diagram is replaced with another diagram (311) shown in FIG. 3(c). Finally, each node in the diagram (311) is transformed into a pass transistor circuit to provide a circuit shown in FIG. 3(d). In this circuit, an input signal has only to pass through just three stages of transistors (320, 321, 322) along a path (319) from input H (318) to output OUT (317). In general, delay time in a circuit increases with increase in the number of stages of transistors through which an input signal passes. Therefore, by decreasing the number of stages of transistors along a critical path of signal transfer as exemplified in this embodiment, delay time can be decreased to improve the speed of the circuit operation.

Then, the following describes principles that reduction in circuit area and power consumption can be realized in a logic circuit formed using a designing method according to the present invention, with reference to FIGS. 7(a) to (c) and 8(a) to (e).

Figure 7B:
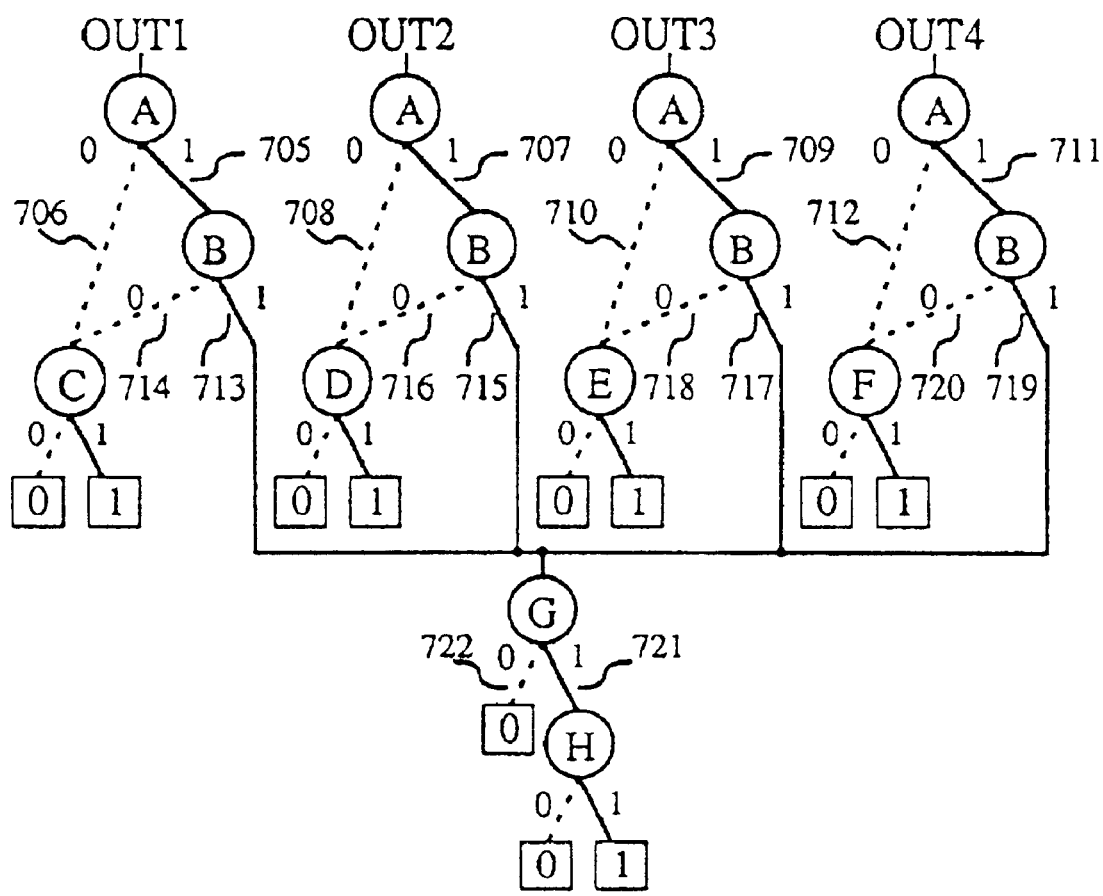
Figure 7C:
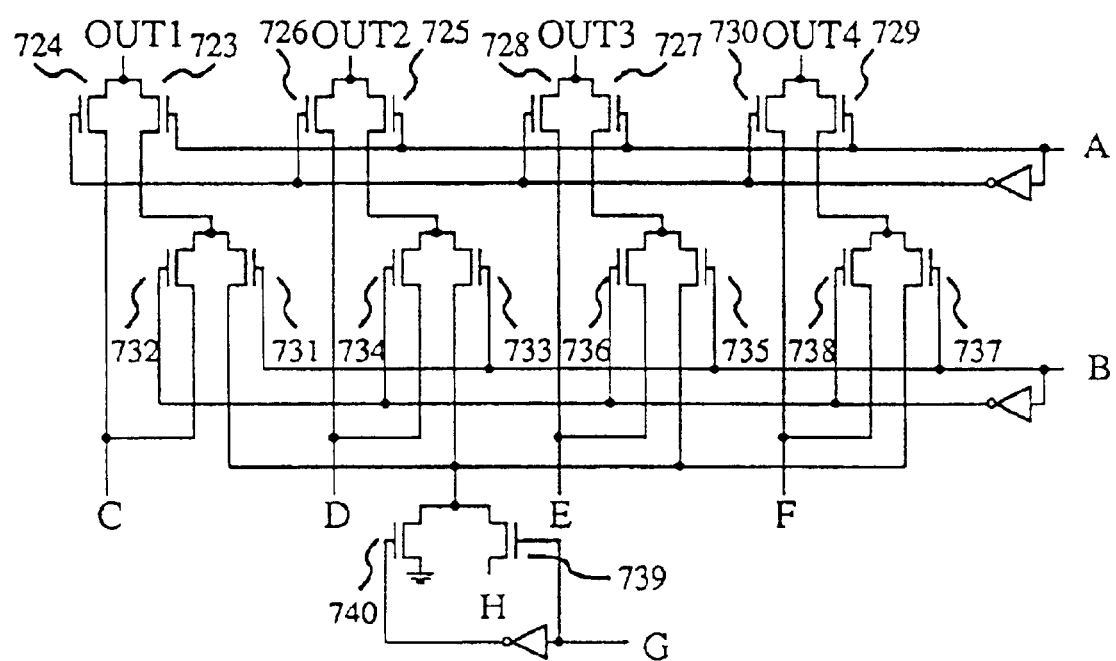

FIG. 7(c) shows a circuit synthesized using the configuration method disclosed in Cited Reference 2. The circuit synthesizing procedure is as follows. First, a logical expression given by a designer (701, 702, 703 and 704 in FIG. 7(a)) is transformed into a binary decision diagram (FIG. 7(b)). In this case, inputs given by the designer are A, B, C, D, E and F, and outputs are OUT1, OUT2, OUT3 and OUT4. Then, each of edges selected by '1' issued by nodes in the diagram (705, 707, 709, 711, 713, 715, 717, 719, 721) or each of edges selected by '0' (706, 708, 710, 712, 714, 716, 718, 720, 722) is respectively replaced with a pass transistor (723, 725, 727, 729, 731, 733, 735, 737, 739) which is controlled by a non-inverted signal of an input to a relevant logic function corresponding to a control is variable for the node or a pass transistor (724, 726, 728, 730, 732, 734, 736, 738, 740) which is controlled by an inverted signal of the input. In practicing the invention, each replacing pass transistor may be a plurality of transistors connected in parallel. If tips of edges respectively selected by '1' and '0' correspond to terminal nodes 1 and 0 respectively, an input signal of the control variable is applied intact instead of replacing each edge by a pass transistor. Also, if tips of edges respectively selected by '1' and '0' correspond to terminal nodes 0 and 1 respectively, an inverted input signal of the control variable is applied. In some cases, for improvement in the circuit operation, a voltage or current amplifier circuit may be inserted depending upon the number of stages of series connection of pass transistors or an output branching condition. For the purpose of simplicity in description, no amplifier circuit is inserted in the exemplary embodiment.

On the other hand, a logic circuit synthesized according to the designing method of the embodiment of the present invention is shown in FIG. 8(d). The circuit synthesizing procedure is shown in FIGS. 8(a), 8(b), 8(c) and 8(d) in order. First, as in the conventional method, a given logical expression (a) is transformed into a binary decision diagram (b). Then, partial diagrams (805, 806, 807, 808) in the binary decision diagram are extracted through automatic determination. The extracted partial diagrams are replaced with other diagrams (817, 818, 819, 820; diagrams in which the number of nodes is '1' because of simplicity in example) while meeting the following conditions (1) and (2), and the output (825) of another binary decision diagram different from (a) is further applied to the control inputs (821, 822, 823, 824) of relevant nodes in these diagrams so that a function identical with a logic function given by a designer is provided in total.

(1) A group of tips respectively pointing outside of the diagram before the replacing, among tips of edges of all the nodes included in the diagram after the replacing coincide with a group of tips respectively pointing outside of the diagram before the replacing, among tips of edges of all the nodes included in the diagram before the replacing.

(2) The diagram after the replacing includes at least one node which has the same configuration as a node in the binary decision diagram, but has a control variable different from an input to a relevant part to be replaced.

Then, each of edges selected by '1' or '0' issued by nodes in the diagram is replaced with a pass transistor (834, 835, 836, 837, 838, 839, 840, 841, 842, 843, 844, 845) which responds to a non-inverted signal or an inverted signal of a control variable or a control input of the node. Thereafter, for improvement in circuit operation, a voltage or current amplifier circuit may be inserted as required. In this case, it is necessary to adjust the number of stages of series connection of pass transistors for which the amplifier circuit is inserted according to requirement.

In the example mentioned above, the number of transistors contained in the circuit shown in FIG. 8(d) is 18, which is smaller than the number of transistors contained in the circuit shown in FIG. 7(c), thereby contributing to reduction in circuit area and power consumption. The number of pass transistors (with counting transistors connected in parallel as one transistor) in the above arrangement is equal to the number of edges extending from nodes in the diagram. Therefore, in practicing the invention for the purpose of reduction in circuit area and power consumption, it is preferable to perform the replacing to decrease the number of nodes in order to decrease the number of transistors. For the replacing through which the number of nodes is decreased while meeting the above conditions (1) and (2), it is necessary to make arrangement so that tips of edges extending from at least two different nodes contained in relevant partial diagrams direct to the same point because of the following reason: If different nodes directing to the same point are not contained in the partial diagram, the number of nodes is determined definitely according to the above condition (2), and therefore it is not possible to decrease the number of nodes. In this example, reduction in circuit area and power consumption can be made in accordance with the present invention. In addition, improvement in delay time can be made in practical implementation. Assuming that arrival time of input H is later than other signals, a signal propagating from input H to each output goes through three stages of pass transistors in the circuit shown in FIG. 7(c), whereas it goes through two stages of pass transistors in the circuit shown in FIG. 8(d). Since the delay time decreases with the decrease in the number of transistors which a signal goes through, it is also possible to make improvement in delay time.

Figure 8E:
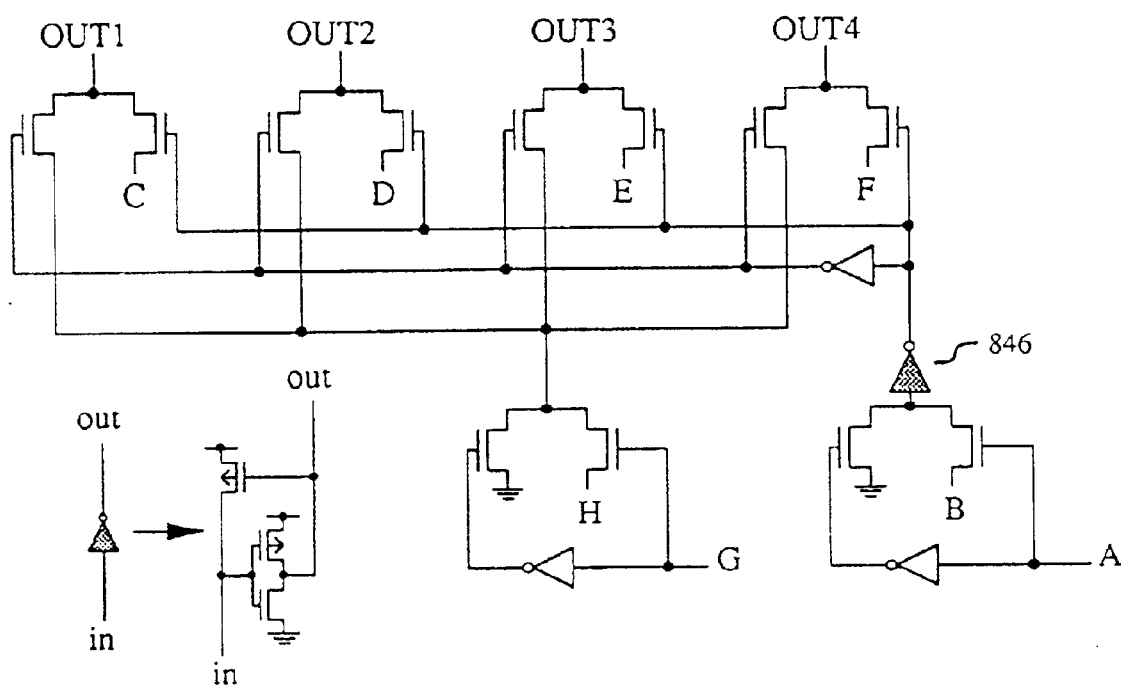

Referring to FIG. 8(e), there is shown a circuit which is formed by inserting a CMOS inverter amplifier circuit (846) at the output of another pass transistor circuit to be used for a gate input of a pass transistor in the circuit shown in FIG. 8(d). In this arrangement, a potential level thereof can be increased sufficiently to a level of power supply voltage. Since a steady-state current does not flow through this circuit, power consumption can be also reduced. The number of transistors contained in the circuit is 21, which is still smaller than the number of transistors contained in the circuit shown in FIG. 7(c).

The binary decision diagram used at the first step in the designing method according to the embodiment of the present invention is the same as that employed in Cited Reference 1. It is to be understood that the present invention is also applicable to a case where a well-known binary decision diagram containing nodes with negation edges is used.

FIG. 11 shows an example in which an automatic designing system in accordance with the present invention is employed for LSI designing. Using a designing method of the present invention on this system, it is possible to generate pass transistor circuits, information on inter-element connection, and information on inter-element-group connection, which are delivered as output data to a designer. In this situation, if mask pattern information of each element or element group is registered in the automatic designing system, it is also possible to automatically generate a mask pattern of an entire logic circuit by combining patterns of elements or element groups. Still more, simulation can be performed to determine values of delay time, occupied area in the chip and power consumption in the synthesized logic circuit. Data values attained in simulation are automatically examined to check if these values meet specified design target values. If the result of determination is negative, an optimum logic circuit can be designed using the procedures shown in FIGS. 1 and 2.

Referring to FIG. 8(d), there is shown a preferred embodiment in which a circuit having four logic functions is formed using a logic circuit configuration method according the present invention. FIG. 8(a) shows the logic functions in logical expression. The circuit configuration method procedure described hereinabove is applicable. The following describes how actually given logic functions are implemented in the circuit shown in FIG. 8(d). First, it will be confirmed that a logic function OUT1 is implemented properly. For ease of understanding, a truth table of the logic function OUT1 is shown in FIG. 10. Output values for each input pattern in this truth table will be checked against outputs of the circuit in FIG. 8(d) to confirm that they are identical.

First, when input A is '0' (on the top 16 rows in the truth table), pass transistor 844 in the circuit shown in FIG. 8(d) turns on to turn on pass transistor 834, causing output OUT1 to become conductive with input C. Therefore, when input C is '0' (on the 1st to 4th rows, and 9th to 12th rows), OUT1 becomes '0'. On the other hand, when input C is '1' (on the 5th to 8th rows, and 13th to 16th rows), OUT1 becomes '1'. These conditions meet the output values in the truth table.

Then, when input A is '1' and input B is '0' (on the next 8(d) rows in the truth table), pass transistor 845 in the circuit shown in FIG. 8 turns on to turn on the pass transistor 834, causing output OUT1 to become conductive with input C. Therefore, when input C is '0' (on the 17th to 20th rows), OUT1 becomes '0'. On the other hand, when input C is '1' (on the 21st to 24th rows), OUT1 becomes '1'. These conditions also meet the output values in the truth table.

Then, when input A is '1', input B is '1', input C is '0' and input G is '0' (on the next two rows in the truth table), the pass transistor 845 in the circuit shown in FIG. 8(d) turns on to turn on pass transistors 835 and 842, causing output OUT1 to become conductive with ground. Therefore, OUT1 becomes '0'. These conditions meet the output values in the truth table.

Then, when input A is '1', input B is '1', input C is '0' and input G is '1' (on the next two rows in the truth table), the pass transistor 845 in the circuit shown in FIG. 8(d) turns on to turn on pass transistors 835 and 843, causing output OUT1 to become conductive with input H. Therefore, when input H is '0' (the 27th row), OUT1 becomes '0'. On the other hand, when input H is '1' (on the 28th row), OUT1 becomes '1'. These conditions meet the output values in the truth table.

Then, when input A is '1', input B is '1', input C is '1' and input G is '0' (on the next two rows in the truth table), the pass transistor 845 in the circuit shown in FIG. 8(d) turns on to turn on the pass transistors 835 and 842, causing output OUT1 to become conductive with ground. Therefore, OUT1 becomes '0'. These conditions meet the output values in the truth table.

Then, when input A is '1', input B is '1', input C is '1' and input G is '1' (on the next two rows in the truth table), the pass transistor 845 in the circuit shown in FIG. 8(d) turns on to turn on pass transistors 835 and 843, causing output OUT1 to become conductive with input H. Therefore, when input H is '0' (the 31st row), OUT1 becomes '0'. On the other hand, when input H is '1' (on the 32nd row), OUT1 becomes '1'. These conditions meet the output values in the truth table.

As mentioned above, it can be confirmed that the logic function OUT1 of the four output logic functions is implemented properly in the circuit formed according to the present invention. As to other three output logic functions (OUT2, OUT3 and OUT4), it is obvious that these logic functions are implemented properly in the circuit formed according to the present invention.

Figure 9B:
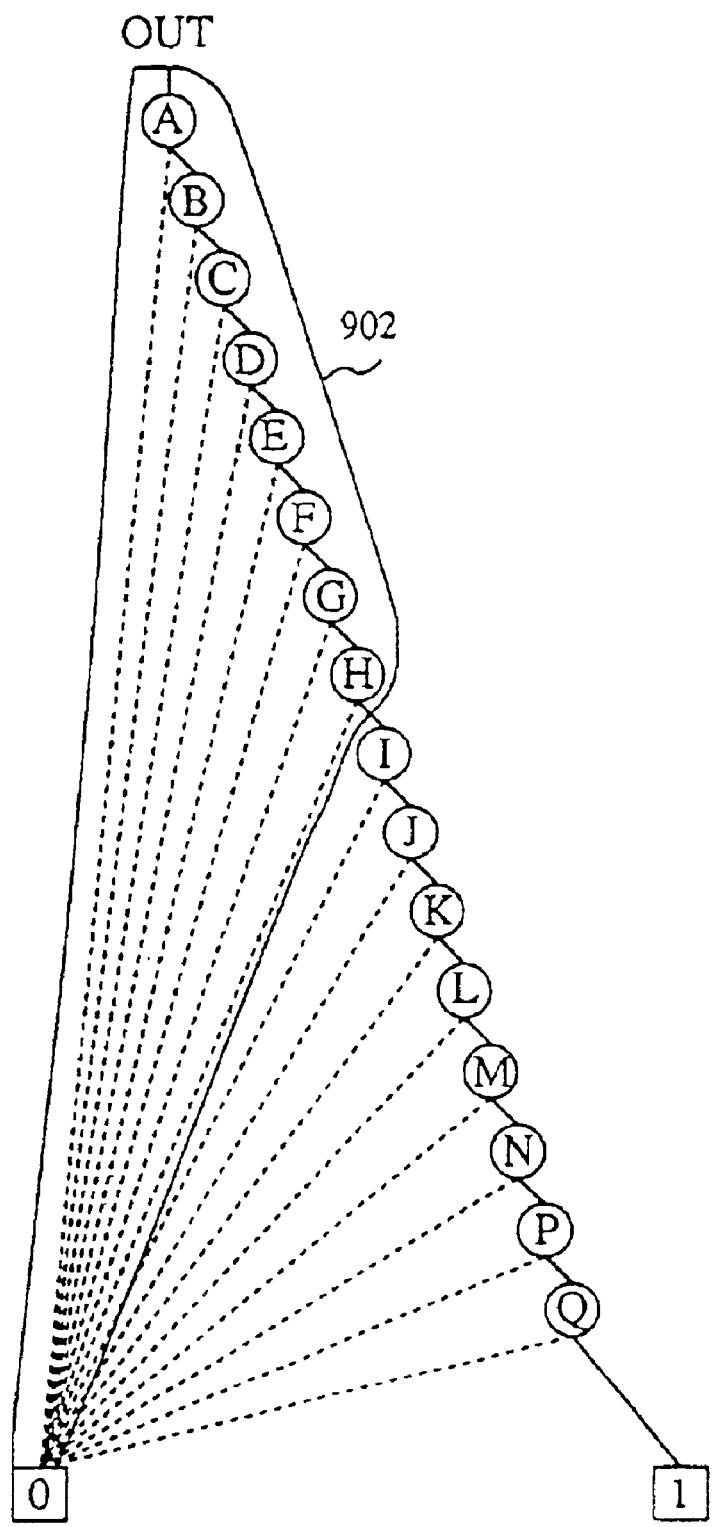
Figure 9C:
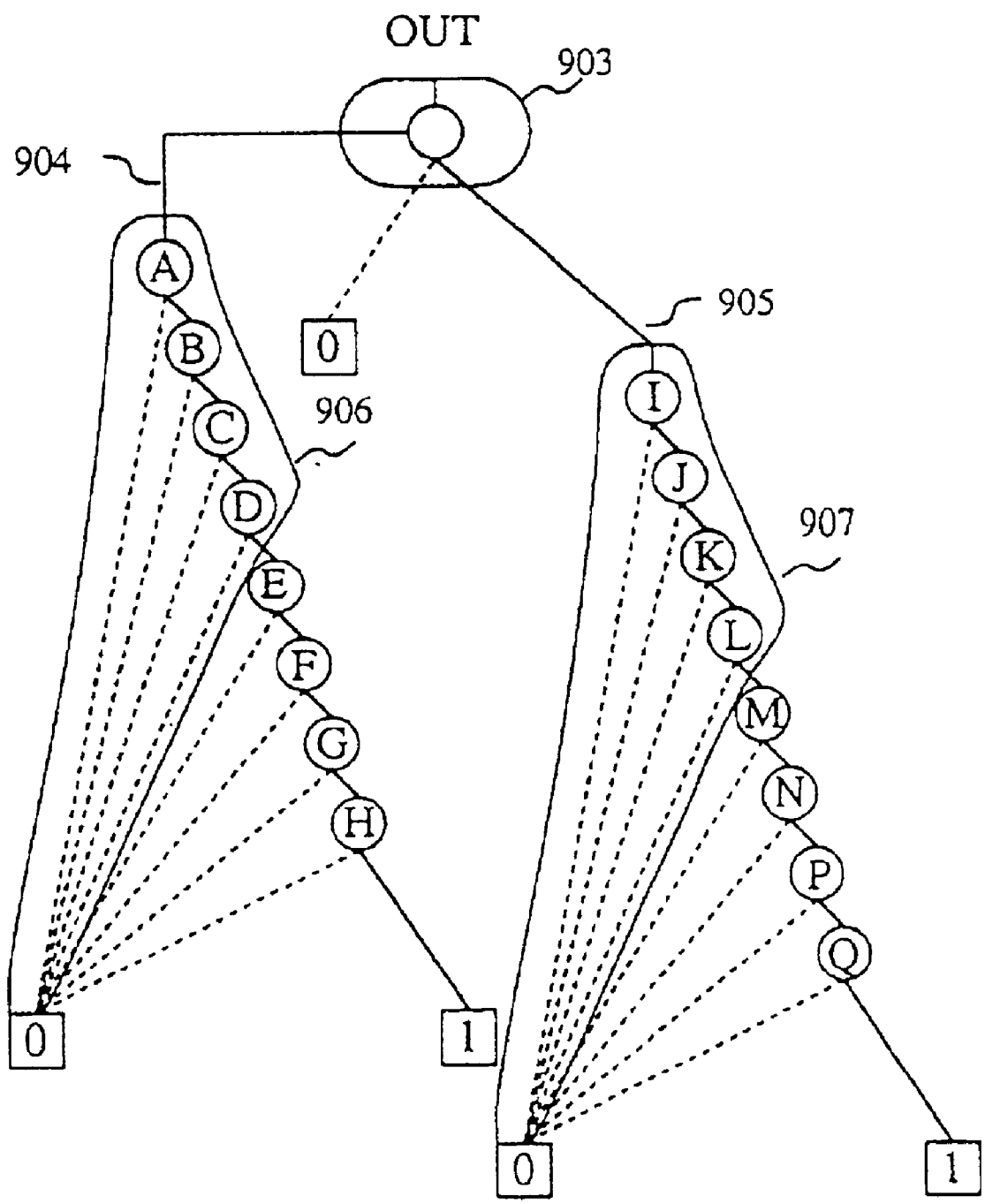
Figure 9D:
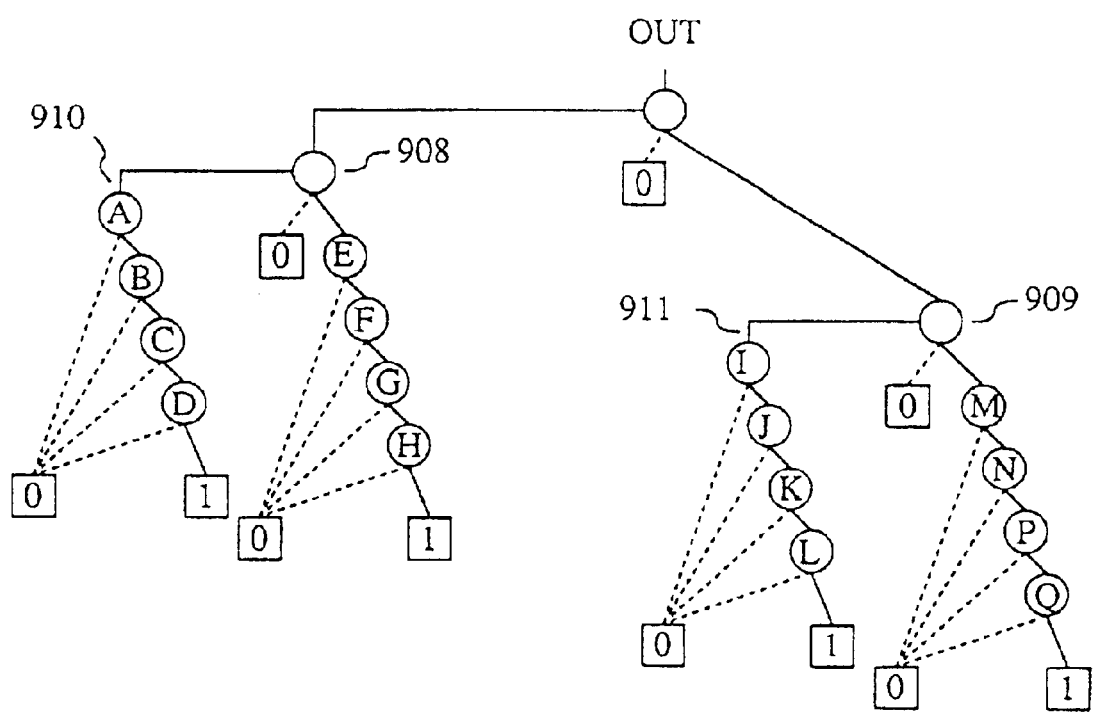
Figure 9E:
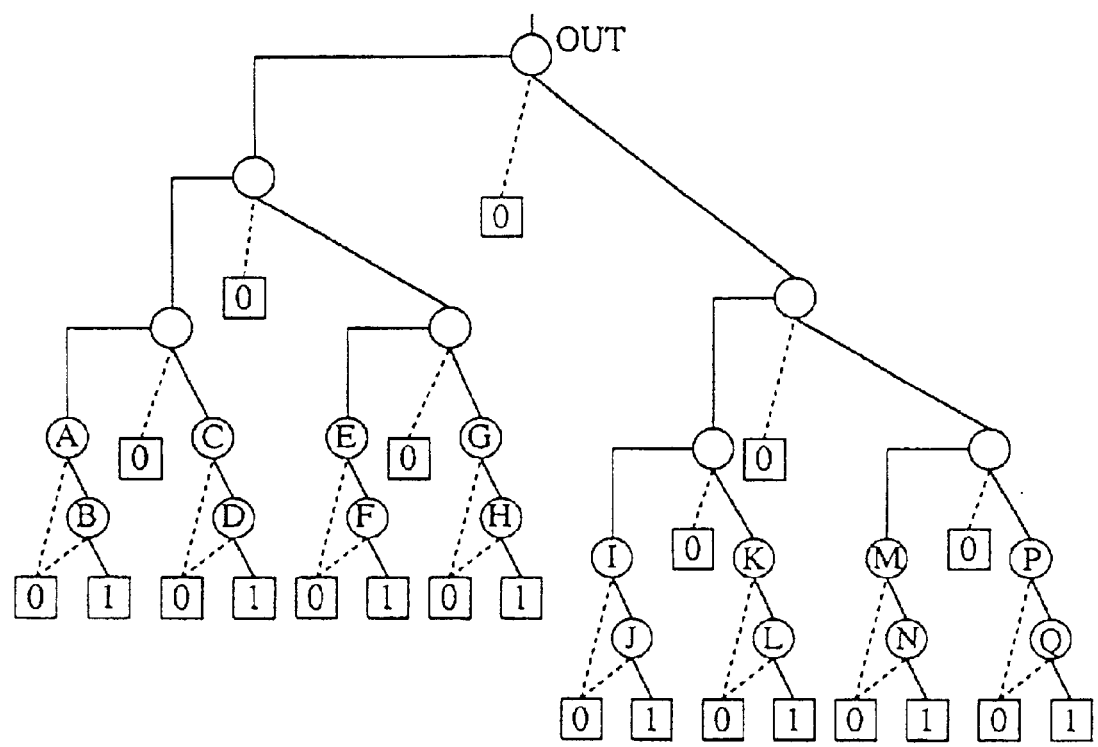
Figure 9F:
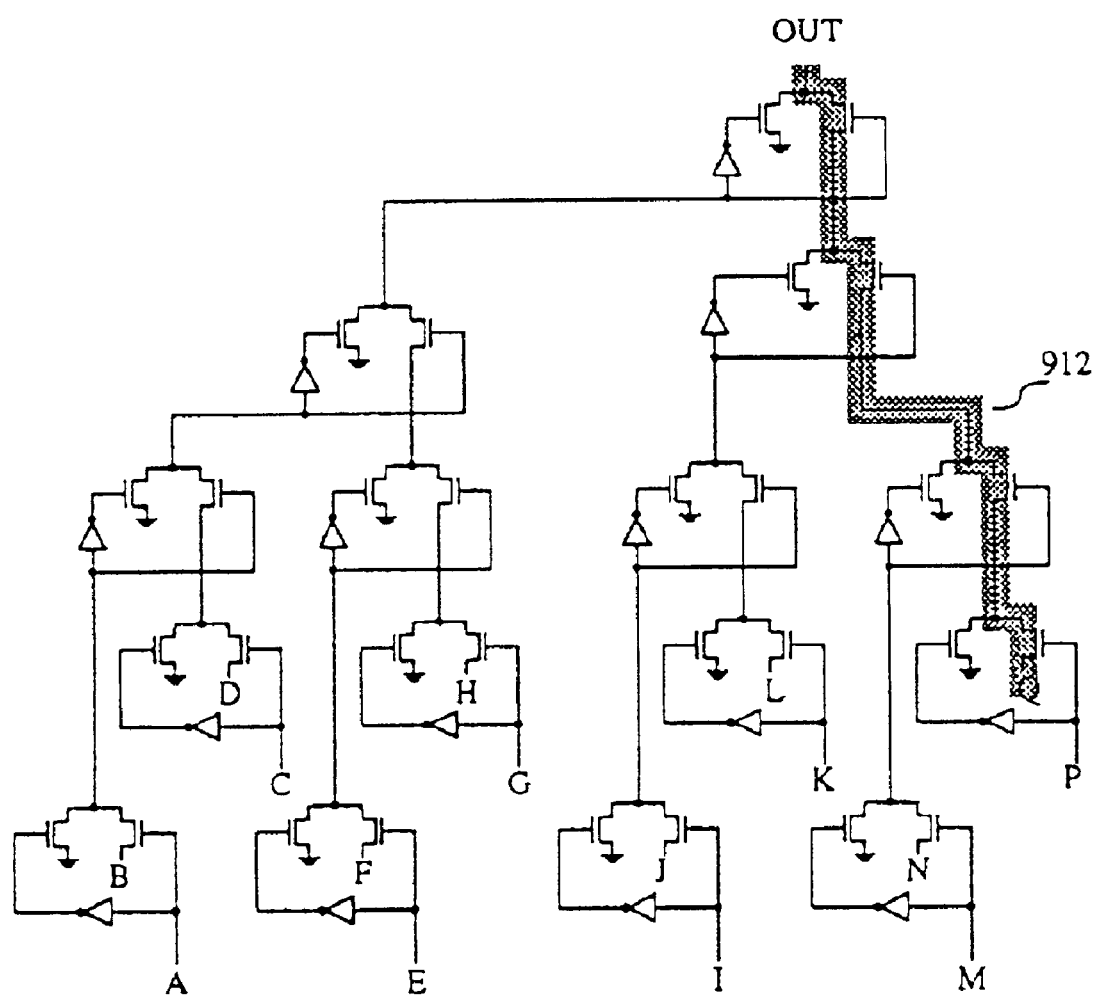
Figure 9G:
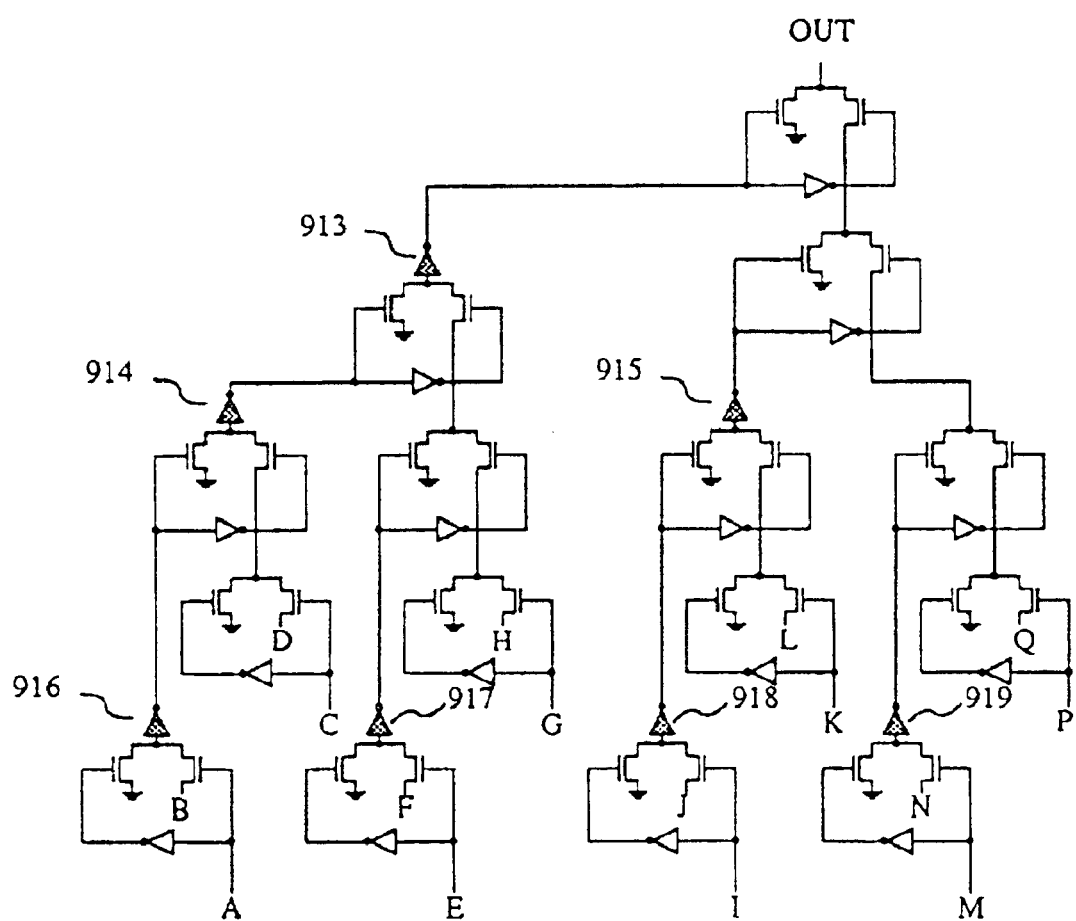
Figure 9H:
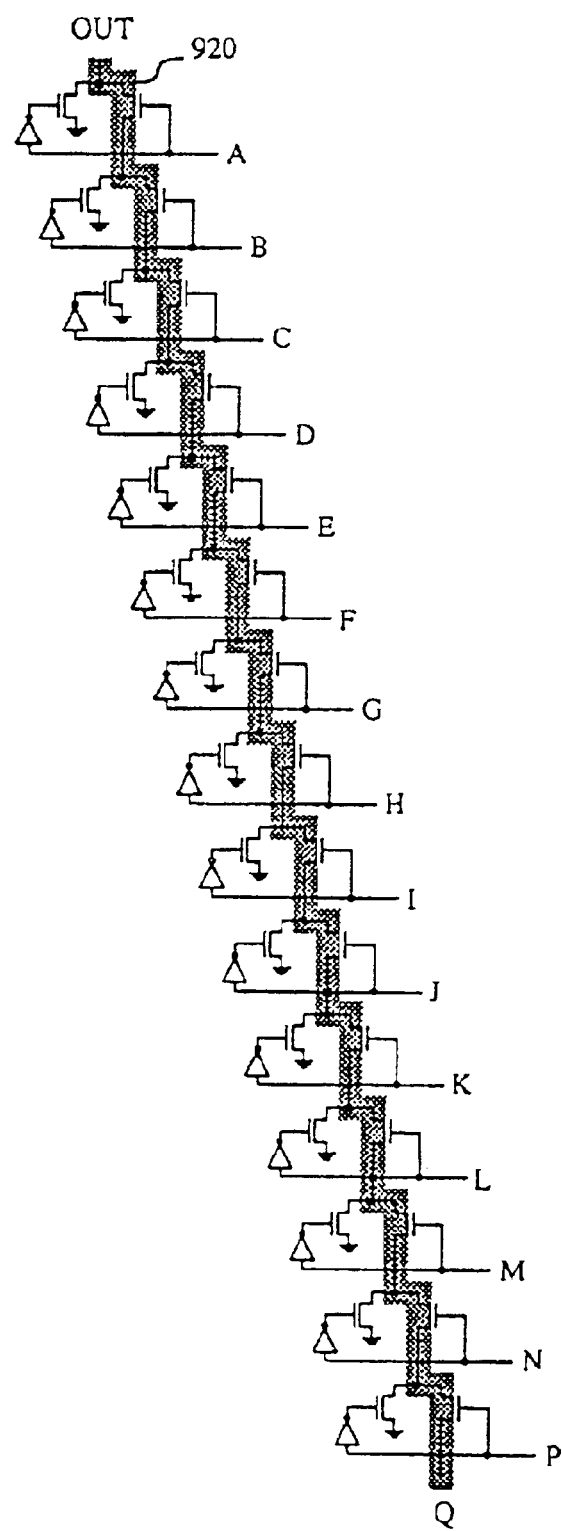

Referring to FIG. 9(f), there is shown a preferred embodiment in which a circuit having a 16-bit logical AND function is formed using a logic circuit designing/configuration method according the present invention. Through use of this example, it is demonstrated that a circuit formed according to the present invention provides a significantly advantageous effect on reduction in delay time. The circuit configuration method according to the present invention is also described in detail with reference to this example. The following description is based on the assumption that input Q of 16-bit logical AND inputs is fed from output of another logical block through which a certain delay time has been involved and arrival time of input Q is later than other input signals.

First, according to the procedure of the present invention, a binary decision diagram (FIG. 9(b)) is prepared using a logic function expression (FIG. 9(a)). Then, a partial diagram, 902 in this example, which has the same group of tips of edges pointing outside of the diagram is extracted from the binary decision diagram, and the partial diagram 902 is replaced with another diagram 903. For a control signal for these nodes, the output of another diagram 904 is given to provide the same logic function as the original (FIG. 9(*c*)).

The diagram shown in FIG. 9(*c*) may be transformed into a pass transistor circuit. In this example, the procedure mentioned above is carried out recursively on the assumption that it is necessary to shorten a delay time further. That is, the above-mentioned procedure is performed on each of diagrams having output 904 and output 905. First, among partial diagrams having output 904, a partial diagram having the same group of tips of edges pointing outside of the diagram, i.e., partial diagram 906 is extracted and replaced with another diagram 908 as shown in FIG. 9(*d*). For a control signal for these nodes, output of another diagram, 910 in this example, is given to provide the same logic function as the original. Also, among partial diagrams having output 905, a partial diagram having the same group of tips of edges pointing outside of the diagram, i.e., partial diagram 907 is extracted and replaced with another diagram 909 as shown in FIG. 9(*d*). For a control signal for these nodes, output of another diagram 911 is given to provide the same logic function as the original.

The above procedure is repeated recursively to provide an arrangement shown in FIG. 9(*e*). At this step, each of all the nodes of plural diagram formed finally is replaced with a source-drain path of a pass transistor, and a non-inverted signal/inverted signal of a control variable of each node is given to the relevant gate terminal, thereby synthesizing a pass transistor circuit shown in FIG. 9(*f*).

For evaluating of the degree of improvement in delay time, the following compares circuits generated by the conventional designing method and the designing method of the present invention. FIG. 9(*h*) shows a conventional circuit formed by the conventional designing method. As shown in this Figure, there are provided 15 stages of pass transistors along a transfer path (920) which a signal determining delay time goes through. In the circuit formed by the designing method of the present invention, there are only four stages of pass transistors along a transfer path (912) through which a signal determining delay time goes. In this case, time required for propagation through 11 stages of pass transistors can be eliminated in the circuit formed by the designing method of the present invention.

FIG. 9(*g*) shows an embodiment of circuit in which voltage amplifier circuits (913, 914, 915, 916, 917, 918, 919) are inserted to prevent a flow of steady-state current in the circuit arrangement shown in FIG. 9(*f*) so that a potential of the gate input is increased sufficiently to power supply voltage level when the gate of the pass transistor gate receives an output from another pass transistor.

Having described our invention as related to the embodiments shown in the accompanying drawings, it is to be understood that the invention is not limited to the specific embodiments and that various changes and modifications may be made in the invention without departing from the spirit and scope thereof.

For instance, in the embodiment shown in FIG. 1 or 2, after a loop through steps 103, 104 and 105 or a loop through steps 203, 204 and 205 is carried out at least once, if a target specification is not met in the second loop execution, the program may be terminated to meet any required limitation on CPU time, memory allocation for the program, etc. Even in this case, it is to be understood that the first loop execution is covered by the technical scope of the present invention. Also, the termination of the program in case that a target specification is not met in the second loop execution is regarded as an effective modification of the target specification in step 101 or step 201, which is also covered by the technical scope of the present invention.

In another modified embodiment of the present invention, field effect transistors for configuring pass transistor circuits are not limited to MOSFETs made of silicon, but MESFETs comprised of GaAs compound semiconductor may be used instead.

Still more, it will be obvious to those skilled in the art that pass transistor logic circuits formed in accordance with the present invention are applicable to such LSI devices as general-purpose processors, signal processors, video processors, etc. in order to reduce entire power consumption and delay time by providing random logic functions for interpreting RISC-type instructions in control of an instruction execution unit, for example.

According to the present invention, there is provided a logic circuit designing method for configuring semiconductor integrated pass transistor circuits which need a smaller number of necessary transistors, and are capable of reducing power consumption and delay time and implementing more complex logic functions.

What is claimed is:

1. A method of designing a logic circuit to be implemented as a semiconductor integrated circuit, the method comprising steps to be executed by a designing device, the steps including:

forming a binary decision diagram, based on a logic function which defines logic relationship between logic inputs and logic outputs of a logic circuit to be designed;

determining a pass-transistor logic circuit corresponding to said binary decision diagram, said pass-transistor logic including a plurality of pass-transistor circuits each corresponding to one of plural nodes which compose said binary decision diagram;

simulating circuit characteristic of said pass-transistor logic circuit;

replacing at least one partial diagram of said binary decision diagram which influences upon circuit characteristics of said pass-transistor logic circuit by another partial diagram, if said simulated circuit characteristic does not meet a predetermined target specification; and repeating said determining step to said simulating step, with respect to said binary decision diagram after said replacing step;

wherein said at least one partial diagram comprises a plurality of nodes connected in a cascade;

wherein said another partial diagram comprises one node which is used instead of said plurality of nodes, and a plurality of nodes which generate logical combination of a plurality of control variables each supplied to one of said plurality of nodes included in said one partial diagram, and supplies said logical combination to said one node as a control variable.

2. A method of designing a logic circuit according to claim 1, further comprising a step of selecting said at least one partial diagram to be replaced, within said formed binary decision diagram, based upon a kind of said predetermined target specification.

3. A method of designing a logic circuit according to claim 1, further comprising a step of determining said another partial diagram, based upon structure of said at least one partial diagram.

4. A method of designing a logic circuit according to claim 1, further comprising the steps of:

judging whether said simulated circuit characteristic meets said predetermines target specification; and executing said replacing step when said simulated circuit characteristic does not meet said predetermined target specification.

5. A method of designing a logic circuit according to claim 1:

wherein said predetermined target specification relates to delay time of said logic circuit to be designed;

wherein said at least one partial diagram is one which corresponds to a circuit portion which influences upon delay time of said pass-transistor logic circuit generated.

6. A method of designing a logic circuit according to claim 1, wherein said replacing step comprises a step of replacing a plurality of partial diagrams by another partial diagram;

wherein each of said plurality of partial diagrams comprises a plurality of nodes and has the same structure with each other;

wherein said another partial diagram comprises a plurality of nodes each used instead of one of said plurality of partial diagrams, and one partial diagram provided in common to said plurality of nodes;

wherein said one partial diagram provided in common generates logical combination of a plurality of control variables each supplied to one of said plurality of nodes included in each of said plurality of partial diagrams, and supplying said logical combination to each of said plurality of nodes used instead of said plurality of partial diagrams, as a control variable.

7. A method of designing a logic circuit according to claim 6, wherein said predetermined target specification relates to at least one of consumption of electric power and a circuit area of said logic circuit to be designed.

8. A method of designing a logic circuit according to claim 1, wherein said predetermined target specification relates to delay time of said that logic circuit to be designed.

9. A method of designing a logic circuit according to claim 1, wherein said predetermined target specification relates to at least one of consumption of electric power and a circuit area of said logic circuit to be designed.

10. A method of manufacturing semiconductor integrated circuit, comprising the steps of:

designing a logic circuit with a designing device;

generating a plurality of mask patterns for production of said designed logic circuit; and producing said semiconductor integrated circuit by using said plurality of mask patterns;

wherein said designing step comprises the steps of;

forming a binary decision diagram, based on a logic function which defines logic relationship between logic inputs and logic outputs of a logic circuit to be designed;

determining a pass-transistor logic circuit corresponding to said binary decision diagram, said pass-transistor logic including a plurality of pass-transistor circuits each corresponding to one of plural nodes which compose said binary decision diagram;

simulating circuit characteristic of said pass-transistor logic circuit;

replacing at least one partial diagram of said binary decision diagram which influences upon circuit characteristics of said pass-transistor logic circuit by another partial diagram, if said simulated circuit characteristic does not meet a predetermined target specification; and repeating said determining step to said simulating step, with respect to said binary decision diagram after said replacing step;

wherein said at least one partial diagram comprises a plurality of nodes connected in a cascade;

wherein said another partial diagram comprises one node which is used instead of said plurality of nodes, and a plurality of nodes which generate logical combination of a plurality of control variables each supplied to one of said plurality of nodes included in said one partial diagram, and supplies said logical combination to said one node as a control variable.

11. A method of manufacturing a semiconductor integrated circuit according to claim 10, further comprising a step of selecting said at least one partial diagram to be replaced, within said formed binary decision diagram, based upon a kind of said predetermined target specification.

12. A method of manufacturing a semiconductor integrated circuit according to claim 10, further comprising a step of determining said another partial diagram, based upon structure of said at least one partial diagram.

13. A method of manufacturing a semiconductor integrated circuit according to claim 10, further comprising the steps of:

judging whether said simulated circuit characteristic meets said predetermined target specification; and executing said replacing step when said simulated circuit characteristic does not meet said predetermined target specification.

14. A method of manufacturing a semiconductor integrated circuit according to claim 10, wherein said predetermined target specification relates to delay time of said logic circuit to be designed;

wherein said at least one partial diagram is one which corresponds to a circuit portion which influences upon delay time of said pass-transistor logic circuit generated.

15. A method of manufacturing a semiconductor integrated circuit according to claim 10, wherein said replacing step comprises a step of replacing a plurality of partial diagrams by another partial diagram;

wherein each of said plurality of partial diagrams comprises a plurality of nodes and has the same structure with each other;

wherein said another partial diagram comprises a plurality of nodes each used instead of one of said plurality of partial diagrams, and one partial diagram provided in common to said plurality of nodes;

wherein said one partial diagram provided in common generates logical combination of a plurality of control variables each supplied to one of said plurality of nodes included in each of said plurality of partial diagrams, and supplying said logical combination to each of said plurality of nodes used instead of said plurality of partial diagrams, as a control variable.

16. A method of manufacturing a semiconductor integrated circuit according to claim 15, wherein said predetermined target specification relates to at least one of consumption of electric power and a circuit area of said logic circuit to be designed.

17. A method of manufacturing a semiconductor integrated circuit according to claim 10, wherein said predetermined target specification relates to delay time of said that logic circuit to be designed.

18. A method of manufacturing a semiconductor integrated circuit according to claim 10, wherein said predetermined target specification relates to at least one of consumption of electric power and a circuit area of said logic circuit to be designed.

19. A computer-readable program recording medium storing a program programmed so as to execute the steps of:

forming a binary decision diagram, based on a logic function which defines logic relationship between logic inputs and logic outputs of a logic circuit to be designed;

determining a pass-transistor logic circuit corresponding to said binary decision diagram, said pass-transistor logic including a plurality of pass-transistor circuits each corresponding to one of plural nodes which compose said binary decision diagram;

simulating circuit characteristic of said pass-transistor logic circuit;

replacing at least one partial diagram of said binary decision diagram which influences upon circuit characteristics of said pass-transistor logic circuit by another partial diagram, if said simulated circuit characteristic does not meet a predetermined target specification; and repeating said determining step to said simulating step, with respect to said binary decision diagram after said replacing step;

wherein said at least one partial diagram comprises a plurality of nodes connected in a cascade;

wherein said another partial diagram comprises one node which is used instead of said plurality of nodes, and a plurality of nodes which generate logical combination of a plurality of control variables each supplied to one of said plurality of nodes included in said one partial diagram, and supplies said logical combination to said one node as a control variable.

20. A program recording medium according to claim 19, wherein said program further executes a step of selecting said at least one partial diagram to be replaced, within said formed binary decision diagram, based upon a kind of said predetermined target specification.

21. A program recording medium according to claim 19, wherein said program further executes a step of determining said another partial diagram, based upon structure of said at least one partial diagram.

22. A program recording medium according to claim 19, wherein said program further executes the steps of:

judging whether said simulated circuit characteristic meets said predetermined target specification; and executing said replacing step when said simulated circuit characteristic does not meet said predetermined target specification.

23. A program recording medium according to claim 19, wherein said predetermined target specification relates to delay time of said logic circuit to be designed;

wherein said at least one partial diagram is one which corresponds to a circuit portion which influences upon delay time of said pass-transistor logic circuit generated.

24. A program recording medium according to claim 19, wherein said replacing step comprises a step of replacing a plurality of partial diagrams by another partial diagram;

wherein each of said plurality of partial diagrams comprises a plurality of nodes and has the same structure with each other;

wherein said another partial diagram comprises a plurality of nodes each used instead of one of said plurality of partial diagrams, and one partial diagram provided in common to said plurality of nodes;

wherein said one partial diagram provided in common generates logical combination of a plurality of control variables each supplied to one of said plurality of nodes included in each of said plurality of partial diagrams, and supplying said logical combination to each of said plurality of nodes used instead of said plurality of partial diagrams, as a control variable.

25. A program recording medium according to claim 24, wherein said predetermined target specification relates to at least one of consumption of electric power and a circuit area of said logic circuit to be designed.

26. A program recording medium according to claim 19, wherein said predetermined target specification relates to delay time of said that logic circuit to be designed.

27. A program recording medium according to claim 19, wherein said predetermined target specification relates to at least one of consumption of electric power and a circuit area of said logic circuit to be designed.

* * * * *